(12) United States Patent
Sano

(10) Patent No.: US 10,943,891 B2
(45) Date of Patent: Mar. 9, 2021

(54) SEMICONDUCTOR MODULE AND POWER CONVERSION APPARATUS

(71) Applicant: FUJI ELECTRIC CO., LTD., Kanagawa (JP)

(72) Inventor: Yuji Sano, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 53 days.

(21) Appl. No.: 16/364,087

(22) Filed: Mar. 25, 2019

(65) Prior Publication Data

US 2019/0363072 A1    Nov. 28, 2019

(30) Foreign Application Priority Data

May 25, 2018   (JP) .............................. JP2018-100822

(51) Int. Cl.
*H01L 25/10* (2006.01)
*H01L 23/31* (2006.01)
(Continued)

(52) U.S. Cl.
CPC ........ *H01L 25/105* (2013.01); *H01L 23/3121* (2013.01); *H01L 23/3675* (2013.01);
(Continued)

(58) Field of Classification Search
CPC .............. H01L 25/105; H01L 23/3675; H01L 23/3121; H01L 23/49541; H01L 24/48; H01L 2224/48091; H01L 2224/48245; H01L 2924/1425; H01L 2924/13055; H01L 2924/1203; H01L 2924/13091; H01L 25/11; H01L 2224/73265; H01L 2224/32245; H01L 2224/48247; H01L 23/49562; H01L 23/36; H01L 23/49551;
(Continued)

(56) References Cited

U.S. PATENT DOCUMENTS

| | | | |
|---|---|---|---|
| 2004/0189114 A1 | 9/2004 | Iwashima | |
| 2011/0284924 A1* | 11/2011 | Teramae | ................. H01L 24/32 257/140 |
| 2015/0097470 A1 | 4/2015 | Sasaki | |

FOREIGN PATENT DOCUMENTS

| | | |
|---|---|---|
| JP | 2004297846 A | 10/2004 |
| JP | 2007116840 A | 5/2007 |

(Continued)

*Primary Examiner* — Kyoung Lee

(57) ABSTRACT

A semiconductor module includes a base plate for dissipating heat and a body having a bottom surface facing the base plate, a top surface opposite the bottom surface, and side surfaces between the bottom and top surfaces, wherein a first main electrode through which a first main current flows faces a first side surface among the side surfaces, and a second main electrode through which a second main current flows faces a second side surface opposite the first side surface. A power conversion apparatus includes a plurality of the semiconductor modules, wherein a cylindrical section is formed by arranging the semiconductor modules to surround a predetermined position, some of the first and second main electrodes are arranged on a first ring-shaped end surface at one end of the cylindrical section, and remaining electrodes are arranged on a second ring-shaped end surface at another end of the cylindrical section.

20 Claims, 27 Drawing Sheets

(51) Int. Cl.

| | | |
|---|---|---|
| *H01L 23/367* | (2006.01) | |
| *H01L 23/495* | (2006.01) | |
| *H01L 23/00* | (2006.01) | |
| *H05K 7/20* | (2006.01) | |
| *H02M 7/00* | (2006.01) | |
| *H02M 7/5387* | (2007.01) | |

(52) U.S. Cl.
CPC ........ *H01L 23/49541* (2013.01); *H01L 24/48* (2013.01); *H02M 7/003* (2013.01); *H05K 7/209* (2013.01); *H01L 2224/48091* (2013.01); *H01L 2224/48245* (2013.01); *H01L 2924/1203* (2013.01); *H01L 2924/13055* (2013.01); *H01L 2924/13091* (2013.01); *H01L 2924/1425* (2013.01); *H02M 7/5387* (2013.01)

(58) Field of Classification Search
CPC ..... H05K 7/209; H05K 7/1432; H02M 7/003; H02M 7/5387; H02M 2001/008; H02M 5/4585
See application file for complete search history.

(56) References Cited

FOREIGN PATENT DOCUMENTS

| | | |
|---|---|---|
| JP | 2008099460 A | 4/2008 |
| JP | 2013188027 A | 9/2013 |
| JP | 2017199827 A | 11/2017 |

\* cited by examiner

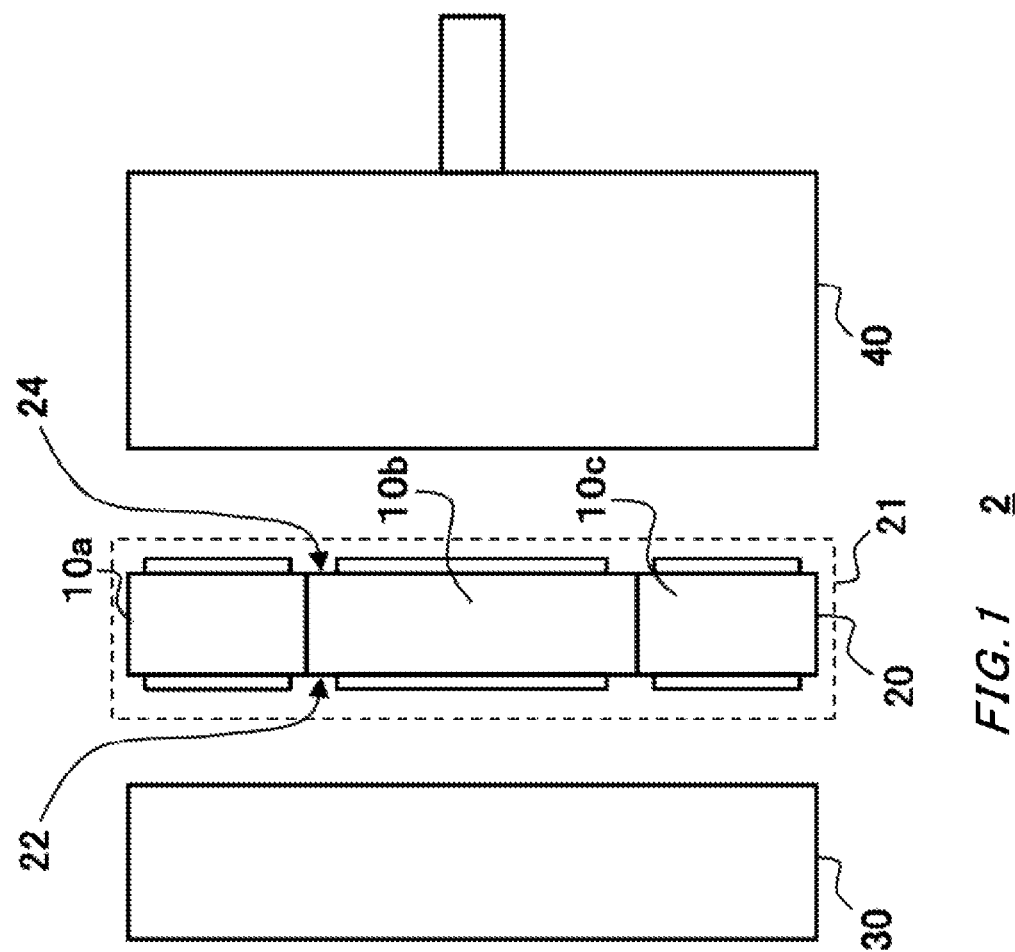
FIG. 1
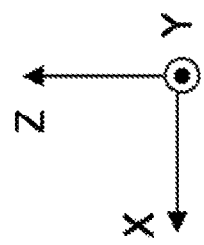

SEMICONDUCTOR MODULE AND POWER CONVERSION APPARATUS

BACKGROUND

1. Technical Field

The present invention relates to a semiconductor module and a power conversion apparatus.

2. Related Art

A semiconductor module with a trapezoidal shape is known. A plurality of trapezoidal semiconductor modules are arranged in a ring, such that the surface corresponding to the short edge of each trapezoid faces the center of the ring, as shown in Patent Documents 1, 2, 3, and 4, for example. Each semiconductor module has a main electrode arranged on each of the surface facing the center of the ring and the surface on the outer circumference of the ring.

Patent Document 1: Japanese Patent Application Publication No. 2013-188027
Patent Document 2: Japanese Patent Application Publication No. 2017-199827
Patent Document 3: Japanese Patent Application Publication No. 2007-116840
Patent Document 4: Japanese Patent Application Publication No. 2008-99460

An attempt to reduce the size and decrease the wire inductance is desired for the semiconductor module, by making the wires between each main electrode and an external apparatus shorter.

SUMMARY

According to a first aspect of the present invention, provided is a semiconductor module. The semiconductor module may comprise a base plate for dissipating heat. The semiconductor module may comprise a body. The body may include a bottom surface and a top surface. The bottom surface may face the base plate. The top surface may be arranged on an opposite side of the bottom surface. The body may include a plurality of side surfaces. The plurality of side surfaces may each be included between the base plate and the top surface. A first main electrode may be arranged facing a first side surface among the plurality of side surfaces. A second main electrode may be arranged facing a second side surface. A first main current may flow through the first main electrode. A second main current may flow through the second main electrode. The second side surface may be on an opposite side of the first side surface.

A third side surface and a fourth side surface may include tapers. The third side surface and the fourth side surface may be side surfaces other than the first side surface and the second side surface among the plurality of side surfaces. The fourth side surface may be arranged on an opposite side of the third side surface.

The third side surface may include a first region and a second region. The second region may be closer to the top surface than the first region. The fourth side surface may include a first region and a second region. The second region may be closer to the top surface than the first region. The tapers may be formed in the second regions. The tapers do not need to be formed in the first regions.

The first main electrode on the first side surface may be provided with a plate fastening portion for linking a plurality of the semiconductor modules to each other. The second main electrode on the second side surface may be provided with a plate fastening portion for linking a plurality of the semiconductor modules to each other.

The semiconductor module may further comprise a control terminal. The control terminal may control the first main current and the second main current. The control terminal may protrude from the top surface.

The first main electrode and the second main electrode may also be arranged on the top surface. The first main electrode and the second main electrode on the top surface may each be provided with a secure fastening portion for linking a plurality of the semiconductor modules to each other.

The first main electrode and the second main electrode may protrude respectively from the first side surface and the second side surface, and extend to the top surface. The first main electrode and the second main electrode may protrude from the top surface, and extend respectively to the first side surface and the second side surface.

According to a second aspect of the present invention, provided is a power conversion apparatus. The power conversion apparatus may include a plurality of semiconductor modules, recoded in any one of the above paragraphs. A cylindrical section may be formed by arranging the plurality of semiconductor modules in a manner to surround a predetermined position. Some electrodes among the first main electrodes and the second main electrodes may be arranged on a first ring-shaped end surface at one end of the cylindrical section. Remaining electrodes among the plurality of the first main electrodes and the plurality of the second main electrodes may be arranged on a second ring-shaped end surface at another end of the cylindrical section.

In each semiconductor module among the plurality of semiconductor modules, a third side surface and a fourth side surface may include tapers. The third side surface and the fourth side surface may be side surfaces other than the first side surface and the second side surface among the plurality of side surfaces. The fourth side surface may be on a side opposite the third side surface. The plurality of semiconductor modules may be arranged such that the tapers of semiconductor modules adjacent to each other face each other.

Each semiconductor module among the plurality of semiconductor modules may include a control terminal. The control terminal may control the first main current and the second main current. The control terminals may be arranged protruding toward an inside of the cylindrical section.

The power conversion apparatus may comprise at least one wire that is connected to the control terminal. The wire may be inserted into the inside of the cylindrical section from at least one of one end and another end of the cylindrical section.

The power conversion apparatus may further comprise a cylindrical outer heat dissipating portion. The base plate of each semiconductor module among the plurality of semiconductor modules may be secured to the outer heat dissipating portion.

Plate fastening portions may be formed on the first main electrode and the second main electrode respectively on the first side surface and the second side surface of each semiconductor module. At least some of the first main electrodes and the second main electrodes that are adjacent to each other may be electrically connected to each other by a plate secured to the plate fastening portion, on at least one of the first ring-shaped end surface and the second ring-shaped end surface of the cylindrical section.

The first main electrode through which the first main current flows and the second main electrode through which the second main current flows may also be arranged on the top surface of each semiconductor module, on an inner surface of the cylindrical section. A secure fastening portion may be provided to each of the first main electrodes and the second main electrodes on the top surface. The secure fastening portions may be fastening portions for linking a plurality of the semiconductor modules to each other. Inside the cylindrical section, the first main electrode provided on the top surface of a semiconductor module may be connected to the first main electrode or the second main electrode provided on the top surface of an adjacent semiconductor module by a plate secured to the secure fastening portion. The second main electrode provided on the top surface of the semiconductor module may be connected to the first main electrode or the second main electrode provided on the top surface of an adjacent semiconductor module by a plate secured to the secure fastening portion.

Each semiconductor module may include a third side surface and a fourth side surface. The third side surface and the fourth side surface may be side surfaces other than the first side surface and the second side surface among the plurality of side surfaces. The fourth side surface may be on a side opposite the third side surface. The cylindrical section may be formed by arranging the plurality of semiconductor modules in a manner to surround a predetermined position, such that the third side surface of a given semiconductor module faces the third side surface or the fourth side surface of another semiconductor module adjacent thereto.

A semiconductor module group may be formed by arranging the plurality of semiconductor modules in an axial direction of the cylindrical section. The plurality of semiconductor modules may be arranged such that the first side surface of a given semiconductor module faces the first side surface or the second side surface of another semiconductor module adjacent thereto. The cylindrical section may be formed by arranging a plurality of the semiconductor module groups in a manner to surround a predetermined position.

The first ring-shaped end surface at one end of the cylindrical section may be provided with a positive electrode terminal and a negative electrode terminal. The positive electrode terminal may be connected to a positive electrode of an input power source. The negative electrode terminal may be connected to a negative electrode of the input power source. The second ring-shaped end surface at the other end of the cylindrical section may be provided with a U terminal, a V terminal, and a W terminal serving as three-phase AC output terminals.

The first main electrodes and the second main electrodes may be arranged in sets of n in an alternating manner, on at least one of the first ring-shaped end surface and the second ring-shaped end surface. n may be a positive integer. The first main electrodes and the second main electrodes may be arranged one at a time in an alternating manner, on at least one of the first ring-shaped end surface and the second ring-shaped end surface.

The summary clause does not necessarily describe all necessary features of the embodiments of the present invention. The present invention may also be a sub-combination of the features described above.

BRIEF DESCRIPTION OF THE DRAWINGS

FIG. 1 shows a case in which a power conversion apparatus 20 according to a first embodiment of the present invention is applied to a motor drive system 2.

DESCRIPTION OF EXEMPLARY EMBODIMENTS

Figure 2:
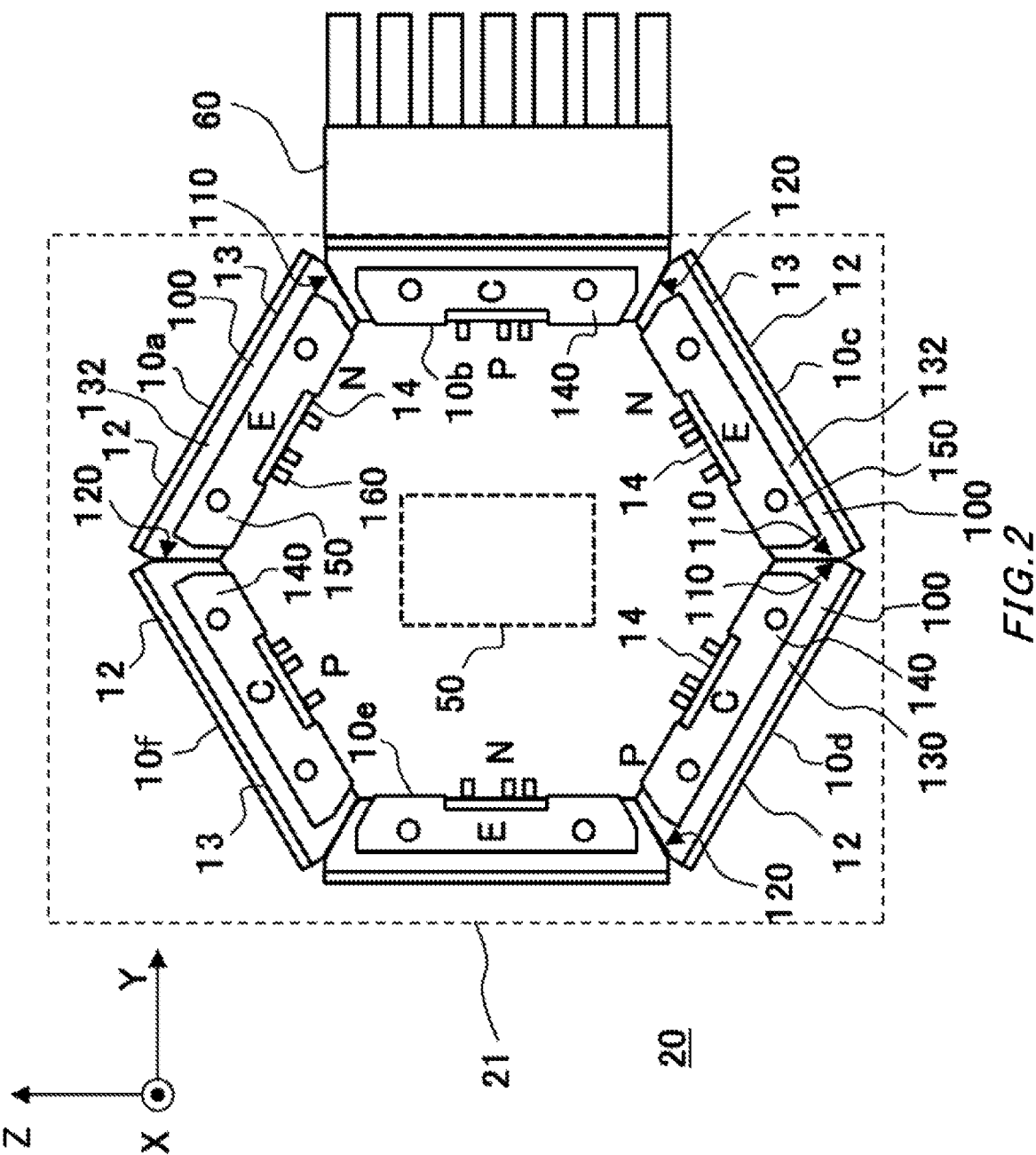
FIG. 2 is a view of the power conversion apparatus 20 seen from the first ring-shaped end surface 22.

Hereinafter, some embodiments of the present invention will be described. The embodiments do not limit the invention according to the claims, and all the combinations of the features described in the embodiments are not necessarily essential to means provided by aspects of the invention.

FIG. 1 shows a case in which a power conversion apparatus 20 according to a first embodiment of the present invention is applied to a motor drive system 2. The motor drive system 2 is an example of a system using the power conversion apparatus 20. The motor drive system 2 includes the power conversion apparatus 20, an input power source 30, and a motor apparatus 40. The power conversion apparatus 20 is an apparatus that converts the power input thereto into different power. Specifically, the power conversion apparatus 20 may be an inverter apparatus that converts DC power input from the input power source 30 into AC power. The input power source 30 may be a DC power supply. The motor apparatus 40 is an example of a load.

The power conversion apparatus 20 of the present example includes a plurality of semiconductor modules 10a to 10f. As described further below, the plurality of semiconductor modules 10a to 10f form a cylindrical section 21. In FIG. 1, the cylindrical section 21 is formed with an axis in the X-axis direction. One end of the cylindrical section 21 forms a first ring-shaped end surface 22, and the other end of the cylindrical section 21 forms a second ring-shaped end surface 24. The first ring-shaped end surface 22 may be arranged facing the input power source 30, and the second ring-shaped end surface 24 may be arranged facing the motor apparatus 40.

Figure 3:
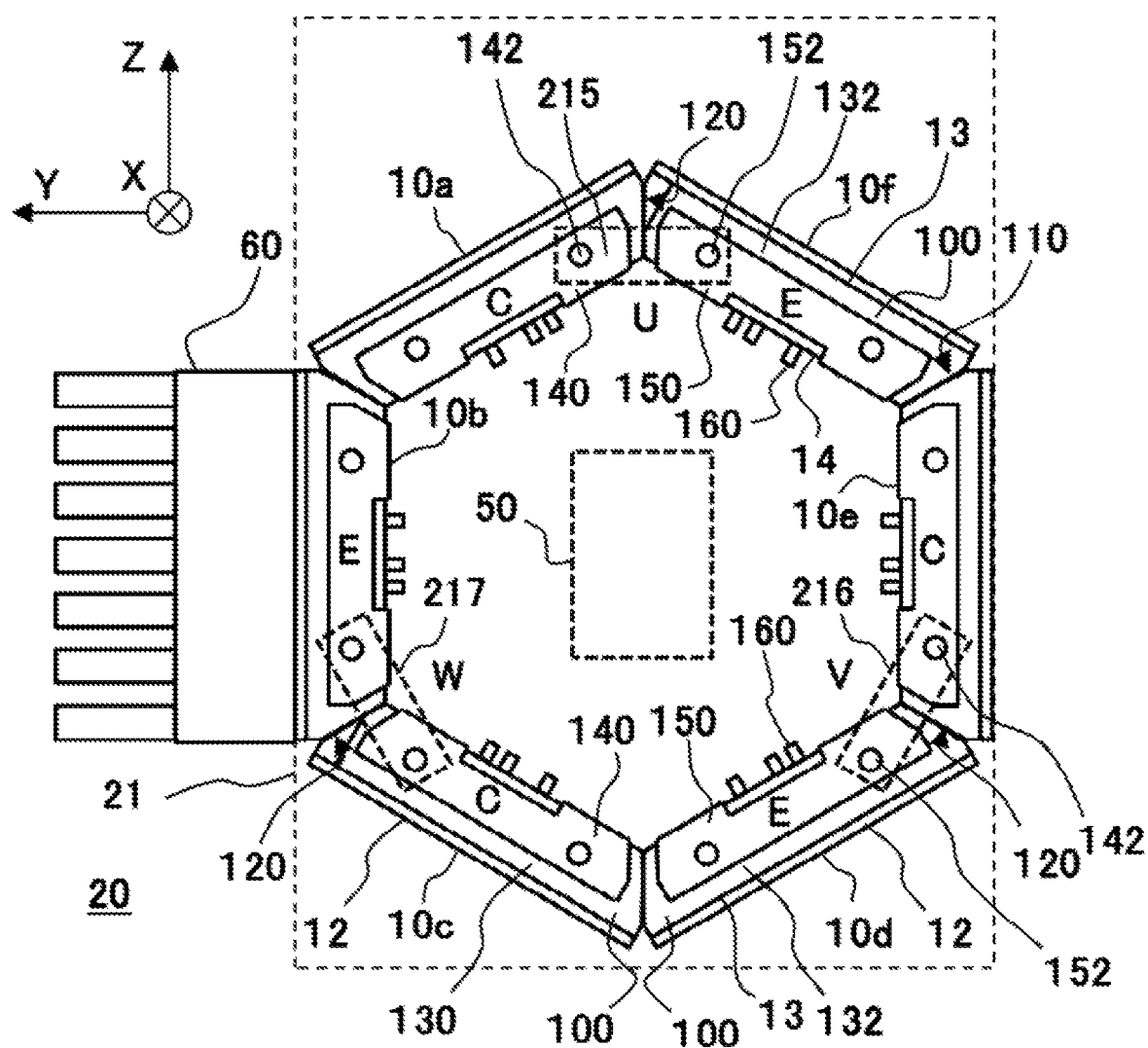
FIG. 3 is a view of the power conversion apparatus 20 seen from the second ring-shaped end surface 24.

FIG. 2 is a view of the power conversion apparatus 20 seen from the first ring-shaped end surface 22. FIG. 3 is a view of the power conversion apparatus 20 seen from the second ring-shaped end surface 24. As shown in FIG. 2 and FIG. 3, the semiconductor modules 10a to 10f (sometimes referred to collectively as the "semiconductor modules 10") are arranged in a manner to surround a predetermined position. In this way, the space inside the cylindrical section 21 is formed. The cylindrical section 21 may be ring-shaped. The shape of the cylindrical section 21 as seen from a direction perpendicular to the end surface may be determined according to the number of semiconductor modules 10 included in the power conversion apparatus 20. In a case where there are six semiconductor modules 10 included in the power conversion apparatus 20, the cylindrical section 21 may have a hexagonal shape as seen from the direction perpendicular to the end surface.

Each semiconductor module 10 includes a base plate 12 for dissipating heat and a body 100. The body 100 may be formed of resin. The body 100 may be formed of thermoplastic resin such as polyphenylene sulfide resin (PPS resin) or polybutylene terephthalate resin (PBT resin). However, the material of the body 100 is not limited to this. The plurality of semiconductor modules 10 may be arranged to form a circle, with the base plate 12 of each semiconductor module 10 arranged facing outward.

The base plate 12 may be formed of metal, ceramic, or resin, or may include a plurality of types of these materials. For example, the base plate 12 may be formed of aluminum, copper, or an alloy including at least one of these materials. As an example, the base plate 12 may be formed of ceramic such as aluminum oxide, aluminum nitride, or silicon nitride. As another example, the base plate 12 may be formed of a metal-based composite material such as a magnesium alloy to which a silicon carbide filler is added or an aluminum alloy to which a silicon carbide filler is added. As yet another example, the base plate 12 may be formed of thermosetting resin such as epoxy resin to which a silicon oxide filler is added. In the case where the base plate 12 is formed of thermosetting resin, the base plate 12 may be formed integrally with the body 100. The base plate 12 may be a single wafer, or may be separated into a plurality of pieces. The base plate 12 itself may function as a cooling board or cooling fin provided with a water cooling function. Alternatively, as shown in FIG. 2 and FIG. 3, the base plate 12 may be connected to a cooling board or cooling fin 60 that is a separate water cooling mechanism. By providing the base plate 12 functioning as a cooling section on the outer circumference of the cylindrical section 21, it is possible to increase the efficiency of the heat dissipation with natural air or water.

The body 100 includes a bottom surface 13 and a top surface 14. The bottom surface 13 faces the base plate 12. The top surface 14 is the surface arranged on the opposite side of the bottom surface 13. The body 100 includes a plurality of side surfaces between the bottom surface 13 and the top surface 14. The plurality of side surfaces include a first side surface 130 and a second side surface 132. The second side surface 132 is a side surface on the opposite side of the first side surface 130. The first side surface 130 and the second side surface 132 may have trapezoidal shapes. The bottom surface 13 may be a surface corresponding to the long sides of the trapezoidal shapes of the first side surface 130 and the second side surface 132. The base plate 12 is provided on the surface corresponding to the long sides of the trapezoidal shapes. The top surface 14 may be a surface corresponding to the short sides of the trapezoidal shapes of the first side surface 130 and the second side surface 132.

Furthermore, the body 100 includes a third side surface 110 and a fourth side surface 120. The third side surface 110 and the fourth side surface 120 are side surfaces other than the first side surface 130 and the second side surface 132, among the plurality of side surfaces of the body 100. The fourth side surface is a side surface on the opposite side of the third side surface. The third side surface 110 and the fourth side surface 120 include tapers. Specifically, the tapers of the third side surface 110 and the fourth side surface 120 are surfaces inclined by an amount greater than or equal to a predetermined angle, from the direction normal to the base plate 12. The angle between each taper and the direction normal to the base plate 12 may be greater than or equal to 20 degrees. The angle between each taper and the direction normal to the base plate 12 may be greater than or equal to 20 degrees and less than or equal to 70 degrees, more preferably greater than or equal to 20 degrees and less than or equal to 40 degrees, and even more preferably 30 degrees.

Figure 5:
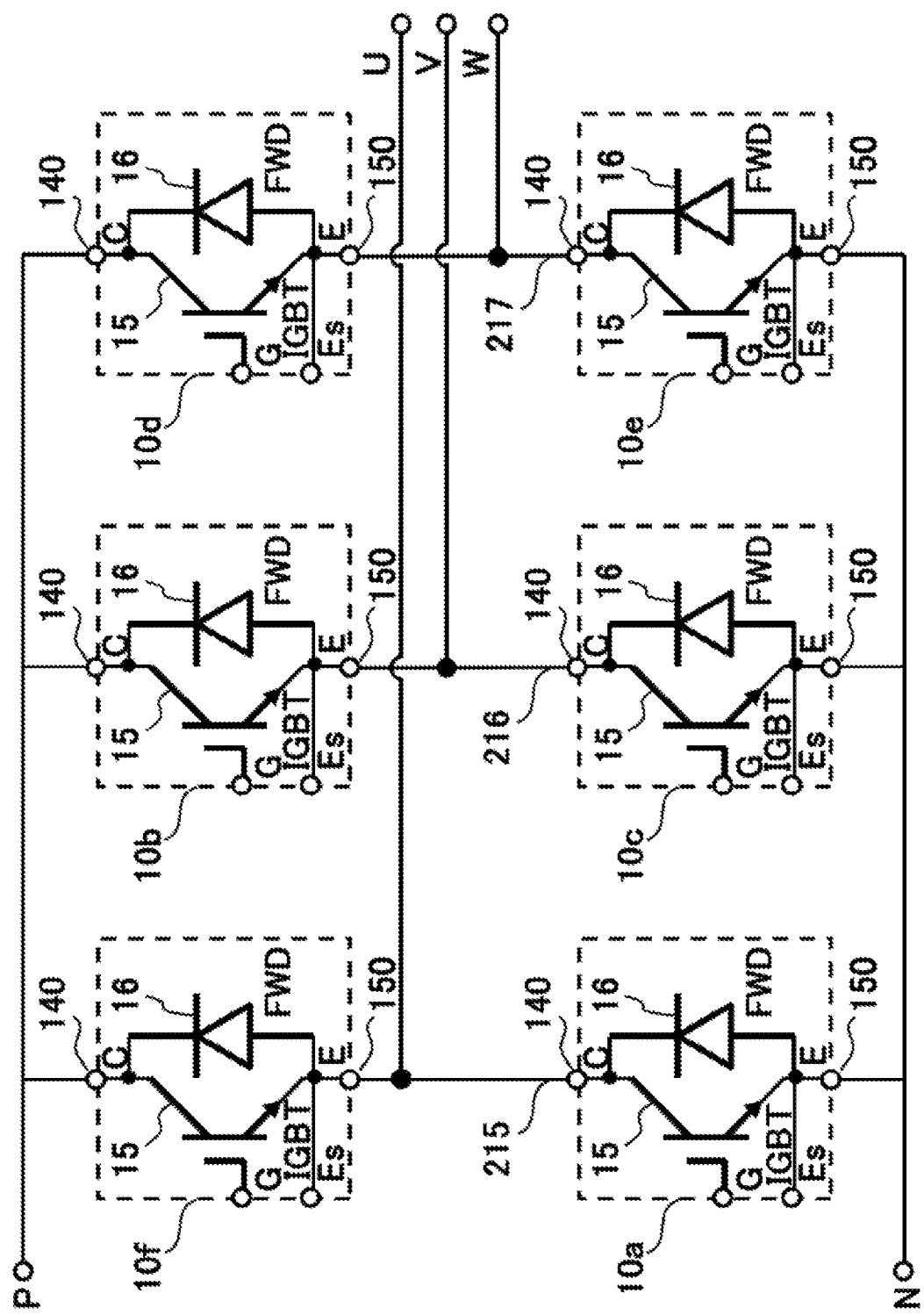
FIG. 5 shows an exemplary circuit configuration of the power conversion apparatus 20.

The plurality of semiconductor modules 10a to 10f are arranged such that the tapers of adjacent semiconductor modules 10 face each other. Since the tapers are included, it is possible to prevent adjacent semiconductor modules 10 from interfering with each other, and to realize a size reduction of the apparatus. For example, in a case where a three-phase inverter circuit is configured such as shown in FIG. 5, by arranging the six semiconductor modules 10a to 10f, in which the angles between the tapers and the direction normal to the base plate 12 are 30 degrees, in a ring shape, as shown in FIG. 2 and FIG. 3, it is possible to efficiently reduce the size of the apparatus.

For example, the adjacent semiconductor modules 10d and 10c are arranged such that the taper of the third side surface 110 of the semiconductor module 10d and the taper of the fourth side surface 120 of the semiconductor module 10c face each other. For each semiconductor module 10, the length along a direction parallel to the top surface 14 on the first side surface 130 and the second side surface 132 may be greater than each length along a direction parallel to the top surface 14 on the third side surface 110 and the fourth side surface 120. The thickness of the cylindrical section 21 in the axial direction can be reduced to make the apparatus smaller.

For each semiconductor module 10, one of the first side surface 130 and the second side surface 132 is exposed at the first ring-shaped end surface 22 at one end of the cylindrical section 21. The other of the first side surface 130 and the second side surface 132 is exposed at the second ring-shaped end surface 24 at the other end of the cylindrical section 21. For example, in the semiconductor module 10c, the first side surface 130 is exposed on the second ring-shaped end surface 24 side as shown in FIG. 3, and the second side surface 132 is exposed on the first ring-shaped end surface 22 side as shown in FIG. 2.

The first main electrode 140 is arranged facing the first side surface 130. The second main electrode 150 is arranged facing the second side surface 132. The first main electrode 140 may correspond to a collector electrode. The second main electrode 150 may correspond to an emitter electrode. In the drawing, C is displayed for the electrode corresponding to the collector electrode, and E is displayed for the electrode corresponding to the emitter electrode. A first main current may flow through the first main electrode 140, in response to the operation of the semiconductor module 10. A second main current may flow through the second main electrode 150, in response to the operation of the semiconductor module 10. The first main current and the second main current may be emitter currents or collector currents. The first main current may be a collector current, and the second main current may be an emitter current. Instead, the first main current may be an emitter current, and the second main current may be a collector current.

The first main electrode 140 (collector electrode) and the second main electrode 150 (emitter electrode) may have shapes that are symmetrical to each other. In order to distinguish between these main electrodes, symbols or characters for identifying the types of main electrodes, such as the letter "C" and the letter "E", may be engraved not only on the body 100 of the semiconductor module 10, but also on the first main electrode 140 (collector electrode) and the second main electrode 150 (emitter electrode).

In the present example, the first main electrodes 140 of the semiconductor modules 10b, 10d, and 10f and the second main electrodes 150 of the semiconductor modules 10a, 10c, and 10e are arranged in an alternating manner along the circumferential direction on the first ring-shaped end surface 22 of the cylindrical section 21, as shown in FIG. 2. In other words, some of the electrodes among the plurality of first main electrodes 140 and the plurality of second main electrodes 150 are arranged on the first ring-shaped end surface 22. As shown in FIG. 3, the remaining electrodes among the plurality of first main electrodes 140 and the plurality of second main electrodes 150 are arranged on the second ring-shaped end surface 24 of the cylindrical section 21.

On the first ring-shaped end surface 22, each first main electrode (collector electrode) may be a positive electrode terminal P connected to the positive electrode of the input power source 30. Each second main electrode (emitter electrode) E may be the negative electrode terminal N connected to a negative electrode of the input power source 30. In other words, positive electrode terminals connected to the positive electrode of the input power source 30 and negative electrode terminals connected to the negative electrode of the input power source 30 are included on the first ring-shaped end surface 22.

In the present example, as shown in FIG. 3, the first main electrodes 140 of the semiconductor modules 10a, 10c, and 10e and the second main electrodes 150 of the semiconductor modules 10b, 10d, and 10f are arranged one at a time in an alternating manner along the circumferential direction on the second ring-shaped end surface 24. Plate fastening portions 142 and plate fastening portions 152 may be formed respectively on the first main electrode 140 and the second main electrode 150, on the first side surface 130 and the second side surface 132 of each semiconductor module 10. The plate fastening portions 142 may include screw holes formed in the first main electrodes 140, and the plate fastening portions 152 may include screw holes formed in the second main electrodes 150.

At least some first main electrodes 140 and second main electrodes 150 that are adjacent are electrically connected to each other by plates 215, 216, and 217 that are secured to the plate fastening portions 142 and plate fastening portions 152, on at least one of the first ring-shaped end surface 22 and the second ring-shaped end surface 24 of the cylindrical section 21. In the present example, as shown in FIG. 3, the plates 215, 216, and 217 are provided on the second ring-shaped end surface 24. The plates 215, 216, and 217 are formed of a conductive material such as metal. For example, the plates 215, 216, and 217 may be formed of aluminum, copper, or an alloy including at least one of these metals.

In the present example, the semiconductor module 10a and the semiconductor module 10f are adjacent to each other. The first main electrode 140 of the semiconductor module 10a and the second main electrode 150 of the semiconductor module 10f protrude at one end portion of the cylindrical section 21. In the present example, the first main electrode 140 of the semiconductor module 10a and the second main electrode 150 of the semiconductor module 10f protrude at the second ring-shaped end surface 24. The first main electrode 140 of the semiconductor module 10a and the second main electrode 150 of the semiconductor module 10f are electrically connected to each other by the plate 215.

In a similar manner, the second main electrode 150 of the semiconductor module 10b and the first main electrode 140 of the semiconductor module 10c are electrically connected by the plate 217. Furthermore, the second main electrode 150 of the semiconductor module 10d and the first main electrode 140 of the semiconductor module 10e are electrically connected by the plate 216.

As shown in FIG. 3, the plates 215, 216, and 217 do not provide connections between the semiconductor module 10a and the semiconductor module 10b, between the semiconductor module 10c and the semiconductor module 10d, and between the semiconductor module 10e and the semiconductor module 10f. Accordingly, the plurality of semiconductor modules 10a to 10f are arranged in a ring shape wherein adjacent semiconductor modules 10 are provided having borders therebetween that alternate between being electrically connected by the plates 215, 216, and 217 and not being connected.

The portion electrically connected to the plate 215 on the second ring-shaped end surface 24, i.e. the connection point between the first main electrode 140 (collector electrode C) of the semiconductor module 10a and the second main electrode 150 (emitter electrode E) of the semiconductor module 10f, corresponds to a U terminal that is one of the three-phase AC output terminals. Similarly, the connection point between the second main electrode 150 (emitter electrode E) of the semiconductor module 10b and the first main electrode 140 (collector electrode C) of the semiconductor module 10c corresponds to a W terminal that is one of the three-phase AC output terminals. Also similarly, the connection point between the second main electrode 150 (emitter electrode E) of the semiconductor module 10d and the first main electrode 140 (collector electrode C) of the semiconductor module 10e corresponds to a V terminal that is one of the three-phase AC output terminals. Accordingly, the second ring-shaped end surface 24 may include the U terminal, the V terminal, and the W terminal as the three-phase AC output terminals.

Each of the plurality of semiconductor modules 10a to 10f may include a control terminal 160 that controls the currents flowing through the first main electrode 140 and the second main electrode 150. The control terminal 160 controls the main currents flowing through the first main electrode 140 and the second main electrode 150. The control terminal 160 may include a gate terminal. The control terminal 160 may be arranged protruding from the top surface 14 of the body 100 of the corresponding semiconductor module 10 toward the inside of the cylindrical section 21.

A control section 50 may be housed in the space inside the cylindrical section 21. The control section 50 may transmit and receive signals to and from the control terminals 160 extending toward the inside of the cylindrical section 21. The control section 50 may provide control signals to gate terminals among the control terminals 160, to control the main currents according to the control signals.

According to the present embodiment, the space inside the cylindrical section 21 can be effectively utilized. The wires of the control system can be consolidated inside the cylindrical section 21. According to the power conversion apparatus 20 of the present embodiment, the input-side DC wires can be consolidated on the first ring-shaped end surface 22 of the cylindrical section 21, the output-side AC wires can be consolidated on the second ring-shaped end surface 24 of the cylindrical section 21, and the wires of the control system can be consolidated inside the cylindrical section 21. Accordingly, each of the wires can be shortened, thereby making it possible to reduce the installation surface area and also to reduce the inductance.

In particular, in a case where the power conversion apparatus 20 is an inverter unit, the main terminals are positioned on both surfaces of the inverter unit, and therefore it is possible to wire the motor and power supply with the shortest length of wires. Furthermore, various types of terminals are laid out at the same distance from the center of the cylindrical section 21. Accordingly, variations in impedance among the plurality of semiconductor modules 10 can be restricted. Furthermore, it is possible to form the current path in a straight line from the input power source 30 to the first ring-shaped end surface 22, and also to form the current path in a straight line from the second ring-shaped end surface 24 to the terminal of the motor apparatus 40. Accordingly, the wire inductance can be reduced.

Figure 4:
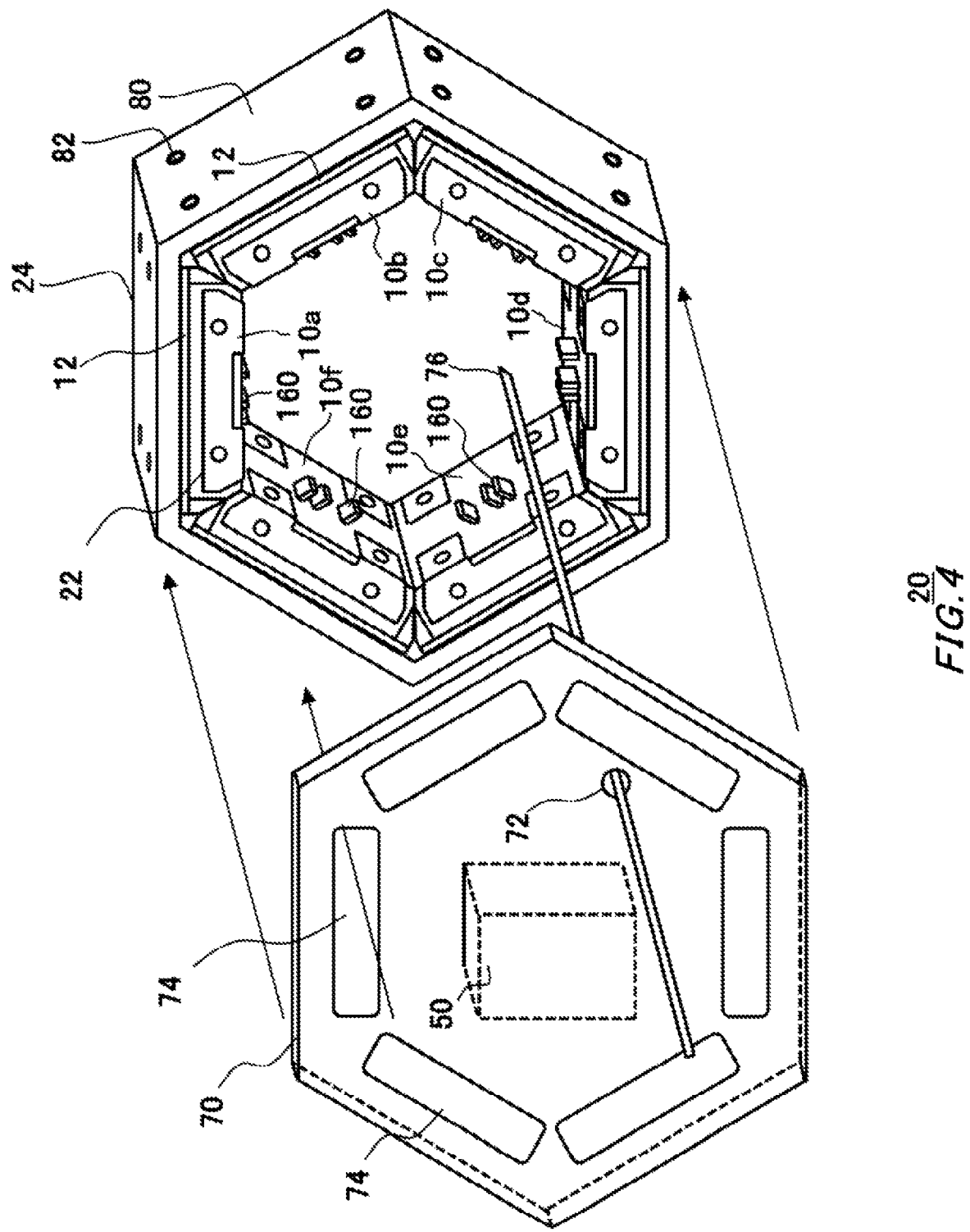
FIG. 4 shows an exemplary configuration of the power conversion apparatus 20.

FIG. 4 shows an exemplary configuration of the power conversion apparatus 20. At least one of the first ring-shaped end surface 22 and the second ring-shaped end surface 24 of the power conversion apparatus 20 may be provided with a support section 70. The support section 70 may be a cover portion provided at the one end or the other end of the cylindrical section 21. The control section 50 may be secured to the inner surface of the support section 70. In a case where support sections 70 are provided on both the first ring-shaped end surface 22 and the second ring-shaped end surface 24, the control section 50 may be supported by this pair of support sections 70. The support sections 70 may be provided with openings 74 and an opening 72 for wires.

At least one wire 76 may be inserted to the inside of the cylindrical section 21 from at least one of the one end and the other end of the cylindrical section 21. In the present example, the wire 76 is inserted to the inside of the cylindrical section 21 from the outside, through the opening 72. The wire 76 that has been inserted may be connected to the control section 50. Alternatively, the control section 50 may be provided outside of the cylindrical section 21. In this case, the wire 76 may be connected to the control terminal 160. The control section 50 may provide control signals to the control terminals 160 through the wire 76, to control the currents flowing through the first main electrodes 140 and the second main electrodes 150. The wire 76 may have a point-to-point construction, or may be provided along a substrate having a size allowing for insertion into the opening 72.

The power conversion apparatus 20 may include a cylindrical outer heat dissipating portion 80. The inner shape of the outer heat dissipating portion 80 seen from the direction perpendicular to the end surface may be determined according to the number of semiconductor modules 10 included in the power conversion apparatus 20. In a case where six semiconductor modules 10 are included in the power conversion apparatus 20, the inner shape of the outer heat dissipating portion may be a hexagon, as seen from the direction perpendicular to the end surface. However, the shape of the outer heat dissipating portion 80 is not limited to such a shape. The cylindrical outer heat dissipating portion 80 is a case in which the plurality of semiconductor modules 10a to 10f are secured, and also functions as a cooling member.

The base plate 12 of each of the plurality of semiconductor modules 10a to 10f may be secured to the outer heat dissipating portion 80. It should be noted that the base plate 12 of each of the plurality of semiconductor modules 10a to 10f only needs to be secured to the outer heat dissipating portion 80, and adjacent semiconductor modules 10a to 10f do not need to be connected to each other. In the present example, the base plate 12 of each of the plurality of semiconductor modules 10a to 10f is secured to the outer heat dissipating portion 80 by a securing means 82. The securing means 82 may be a screw. However, the securing method is not limited to such a method.

FIG. 5 shows an exemplary circuit configuration of the power conversion apparatus 20. The power conversion apparatus 20 is described while referencing FIG. 2 and FIG. 3 above. The power conversion apparatus 20 includes a positive electrode terminal P and a negative electrode terminal N, serving as input terminals. The power conversion apparatus 20 includes the U terminal, the V terminal, and the W terminal as three-phase AC output terminals serving as output terminals.

In the present example, the power conversion apparatus 20 includes the six semiconductor modules 10a to 10f The semiconductor modules 10a to 10f each include one or more transistors 15 and one or more diodes 16. Each semiconductor module 10 in the present example may be a so-called one-in-one type of semiconductor module. In the present example, the transistor 15 is an IGBT (Insulated Gate Bipolar Transistor). In the present example, the diode 16 is an FWD (Free Wheeling Diode).

It should be noted that the each semiconductor module 10 may include the transistor 15 without including the diode 16. For example, the semiconductor module 10 may include a reverse blocking-IGBT (RB-IGBT) as the transistor 15. Furthermore, the transistor 15 and the diode 16 are not limited to an IGBT and an FWD. For example, a MOSFET (Metal Oxide Semiconductor Field Effect Transistor) using a compound semiconductor material may be included as the transistor 15. A Schottky barrier diode or PN diode may be included as the diode 16. SiC (silicon carbide) and GaN (gallium nitride) are examples of the compound semiconductor material.

In each semiconductor module 10, the transistor 15 and the diode 16 may be connected in anti-parallel. In other words, the collector electrode of the transistor 15 and the cathode of the diode 16 are connected, and the emitter electrode of the transistor 15 and the anode of the diode 16 are connected. In the present example, the collector electrode and the emitter electrode of an IGBT are shown as examples of the first main electrode and the second main electrode, but the first main electrode and the second main electrode may instead be the source electrode and the drain electrode of a MOSFET. In the case where the transistor 15 is a MOSFET, the first main current may be the source current and the second main current may be the drain current, or alternatively, the first main current may be the drain current and the second main current may be the source current.

The circuit shown in FIG. 5 corresponds to an inverter circuit. The semiconductor modules 10f, 10b, and 10d form an upper arm, and the semiconductor modules 10a, 10c, and 10e form a lower arm. The first main electrode 140 that is the collector electrode C of the semiconductor module 10c and the second main electrode 150 that is the emitter electrode of the semiconductor module 10f are electrically connected by the plate 215. Similarly, the first main electrode 140 that is the collector electrode C of the semiconductor module 10a and the second main electrode 150 that is the emitter electrode of the semiconductor module 10b are electrically connected by the plate 216. The first main electrode 140 that is the collector electrode C of the semiconductor module 10e and the second main electrode 150 that is the emitter electrode of the semiconductor module 10d are electrically connected by the plate 217. The connection point caused by the plate 215, the connection point caused by the plate 216, and the connection point caused by the plate 217 correspond respectively to the U terminal, the V terminal, and the W terminal serving as the three-phase AC output terminals.

Figure 6:
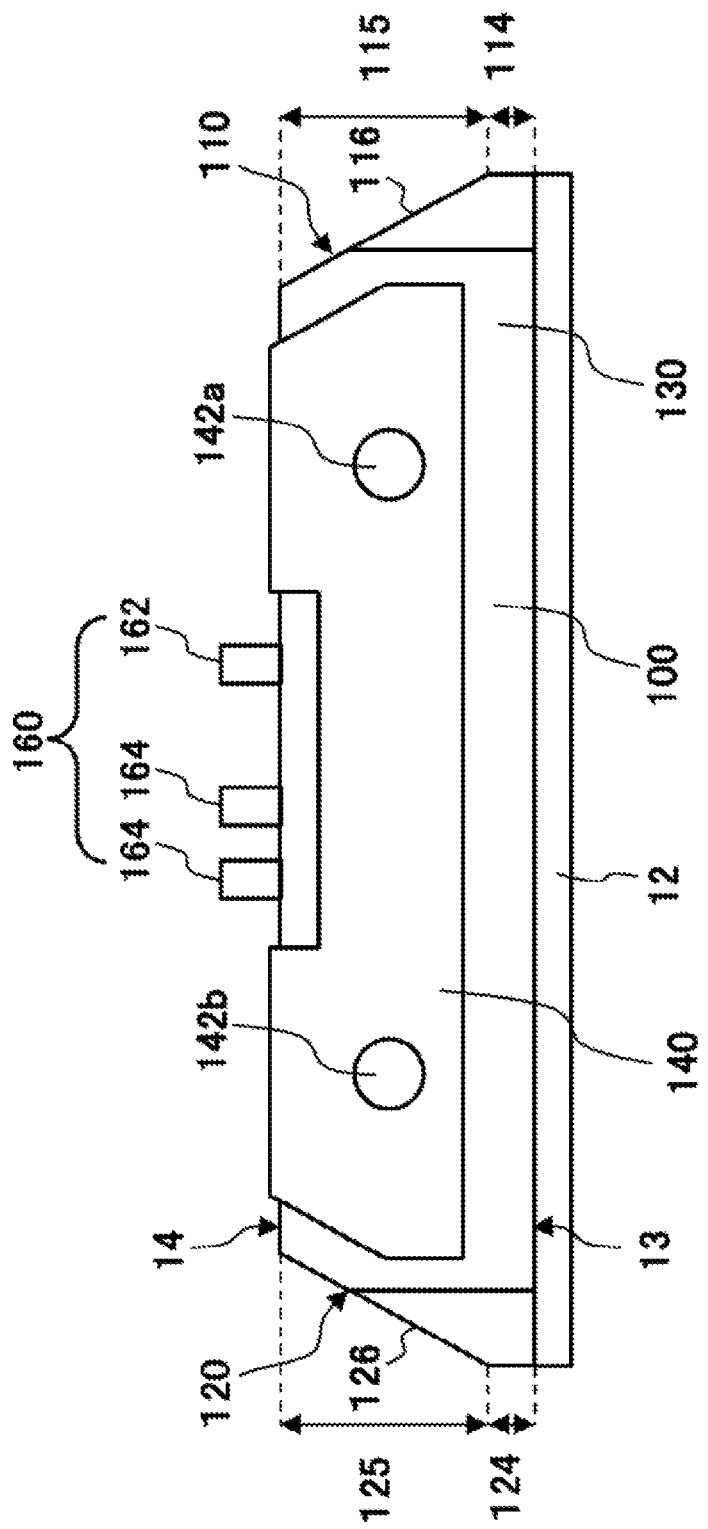
FIG. 6 is a side surface view showing an exemplary semiconductor module 10 according to an embodiment of the present invention.
Figure 7:
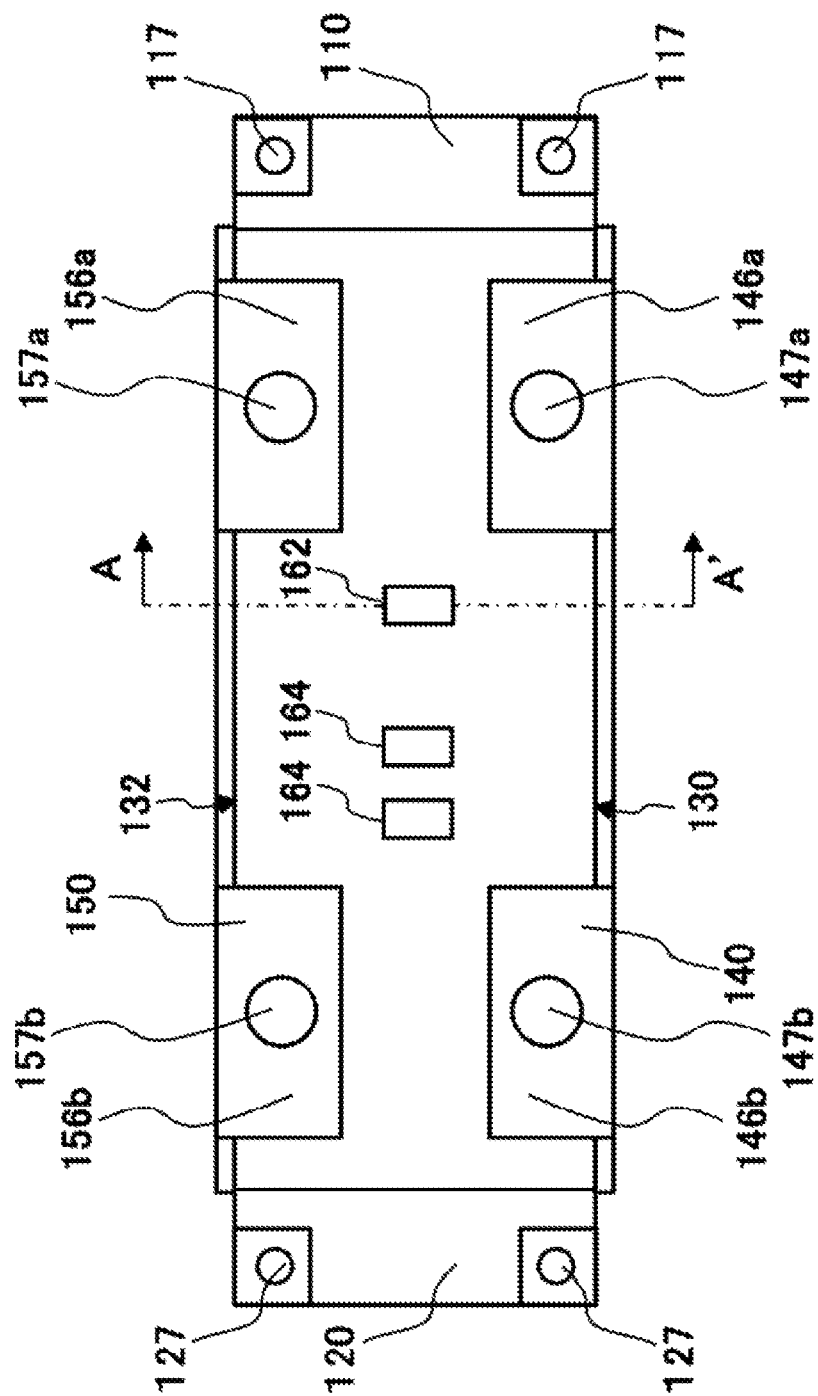
FIG. 7 is a top surface view showing the exemplary semiconductor module 10.

FIG. 6 is a side surface view showing an exemplary semiconductor module 10 according to an embodiment of the present invention. FIG. 7 is a top surface view showing the exemplary semiconductor module 10. The third side surface 110 and the fourth side surface 120 of the body 100 respectively include tapers 116 and 126. However, the taper 116 does not need to span the entire region of the third side surface 110.

The third side surface 110 may include a first region 114 and a second region 115. The second region 115 is closer to the top surface 14 of the body 100 than the first region 114 is. The taper 116 is included in the second region 115, but is not provided in the first region 114. In other words, in the second region 115, the angle between the third side surface 110 and the direction normal to the base plate 12 may be greater than or equal to 20 degrees, and in the first region 114, the angle between the third side surface 110 and the direction normal to the base plate 12 may be less than or equal to 20 degrees.

The fourth side surface 120 may also have a first region 124 and a second region 125, in a similar manner as the third side surface 110. The taper 126 is included in the second region 125, but is not provided in the first region 124. It is possible for the first regions 114 and 124 to be formed with sharp protruding triangular portions, but these portions would be thin. Accordingly, it would be impossible to ensure enough space within these triangular portions to arrange a chip or the like. Furthermore, by not including these sharp triangular portions, it is possible to prevent injuries that would be caused by the sharpened points.

In this example, the first main electrode 140 is provided with a plurality of plate fastening portions 142. Specifically, two plate fastening portions 142a and 142b are provided. The plate fastening portion 142a is provided at a position near the third side surface 110, as seen from a center position of the first side surface 130 in the longitudinal direction. The plate fastening portion 142b is provided at a position near the fourth side surface 120, as seen from the center position of the first side surface 130 in the longitudinal direction. In this way, the degree of freedom when linking the plurality of semiconductor modules 10 is increased. However, the shape of the first main electrode 140 is not limited to such a shape.

A control terminal 164 for sensing or the like may be provided, in addition to a control terminal 162 that controls the currents flowing through the first main electrode 140 and the second main electrode 150, as a control terminal 160. The control terminal 164 may also protrude from the top surface 14 of the body 100.

As shown in FIG. 7, the first main electrode 140 may include extending portions 146a and 146b that extend above the top surface 14 of the body 100. In the present example, the extending portions 146a and 146b are provided with screw holes functioning as secure fastening portions 147a and 147b. The secure fastening portions 147 are used when linking the plurality of semiconductor modules 10 to each other.

The second main electrode 150 also includes extending portion 156a and 156b, in the same manner as the first main electrode 140. The extending portion 156a and 156b are provided with screw holes functioning as secure fastening portions 157a and 157b. It should be noted that a separate electrode that is electrically connected to the first main electrode 140 inside the semiconductor module 10 may be formed protruding from the top surface 14 of the body 100, and secure fastening portions may be formed in this separate electrode. With such a configuration, the secure fastening portions may be provided above the top surface 14 of the body 100. However, according to the example shown in FIG. 7, there is no need for another conductive member to extend on the top surface 14, since the first main electrode 140 and the second main electrode 150 extend above the top surface 14.

Figure 8:
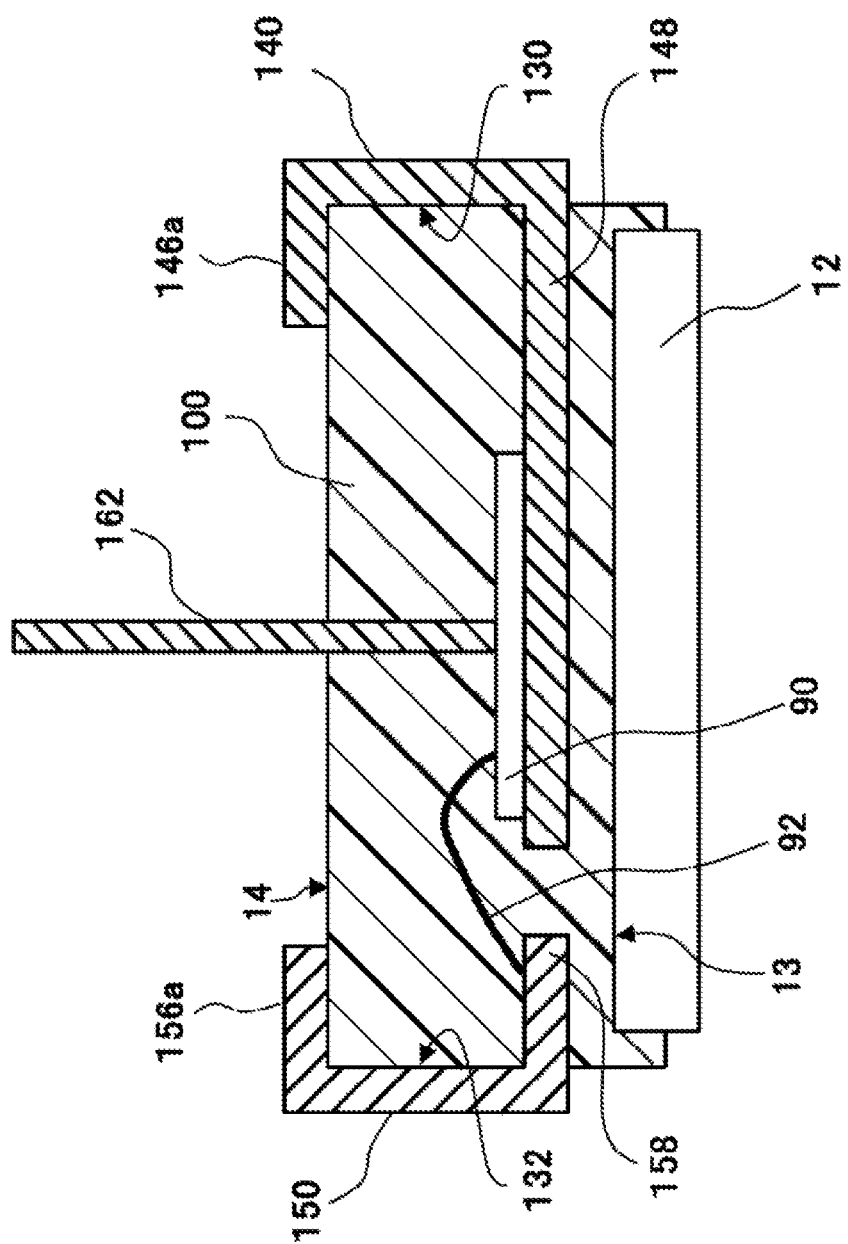
FIG. 8 is a cross-sectional view of the semiconductor module 10 along the line A-A' of FIG. 7.

FIG. 8 is a cross-sectional view of the semiconductor module 10 along the line A-A' of FIG. 7. The semiconductor module 10 includes therein a first wire portion 148, a second wire portion 158, a wire member 92, and a semiconductor chip 90. The semiconductor chip 90 may be electrically connected to the first wire portion 148 and the control terminal 162, by solder or the like not shown in the drawings. The semiconductor chip 90 may be electrically connected to the second wire portion 158 via the wire member 92. The wire member 92 is a bonding wire, for example. The semiconductor chip 90 may be electrically connected to the first wire portion 148, the second wire portion 158, and the control terminal 162 via a lead frame, post electrode, print substrate, and the like, which are not shown in the drawings.

If the base plate 12 is a conductor such as metal, there is no direct contact between the base plate 12 and the first wire portion 148 and second wire portion 158. If the base plate 12 is an insulator such as ceramic, the base plate 12 may contact the first wire portion 148 and second wire portion 158.

A layered substrate may be included between the base plate 12 and the first wire portion 148 and second wire portion 158. This layered substrate includes a metal layer, an insulating layer, and a circuit layer, in order from the side close to the base plate 12, for example. The metal layer and the base plate 12 may be bonded by soldering. The circuit layer may be a metal layer, such as a copper layer, on which a circuit pattern is formed. The semiconductor chip 90, the first wire portion 148, the second wire portion 158, and the wire member 92 may be connected to the circuit layer by soldering, supersonic bonding, or the like. The transistor 15 and one diode 16 may be separate semiconductor chips.

The first wire portion 148 provides a connection between the semiconductor chip 90 and the first main electrode 140, without passing through the top surface 14 of the body 100. The second wire portion 158 provides a connection between the wire member 92 and the first main electrode 140, without passing through the top surface 14 of the body 100. In the present example, the first wire portion 148 extends toward the first side surface 130 inside the body 100 formed of resin. The first wire portion 148 protrudes from the body 100 at the first side surface 130, and is connected to the first main electrode 140. The first wire portion 148 may be formed integrally with the first main electrode 140. The second wire portion 158 extends toward the second side surface 132 inside the body 100 formed of resin. The second wire portion 158 protrudes from the body 100 at the second side surface 132, and is connected to the second main electrode 150. The second wire portion 158 may be formed integrally with the second main electrode 150. According to such a configuration, each current path from the semiconductor chip 90 to the first main electrode 140 and the second main electrode 150 is shortened, and it is possible to reduce the inductance. The first wire portion 148 and the second wire portion 158 may each include two or more wires and a lead frame.

In the semiconductor module 10, the first main electrode 140 (collector electrode) and the second main electrode 150 (emitter electrode) may have shapes that are symmetrical to each other. In particular, as shown in FIG. 7, the secure fastening portions 147a and 147b of the first main electrode 140 and the secure fastening portions 157a and 157b of the second main electrode 150 may be provided at positions that are symmetrical, whichever of a vertical bisector of the longitudinal direction length of the top surface 14 of the semiconductor module 10 and a vertical bisector of the transverse direction length of the top surface 14 is used as a reference. In this way, it is possible to not only arrange the plurality of semiconductor modules 10 stereoscopically as shown in FIG. 2 and FIG. 3, but also to make various other linking arrangements. In particular, it is possible to link the plurality of semiconductor modules 10 in a plane, in the same manner as conventional semiconductor modules.

Figure 9:
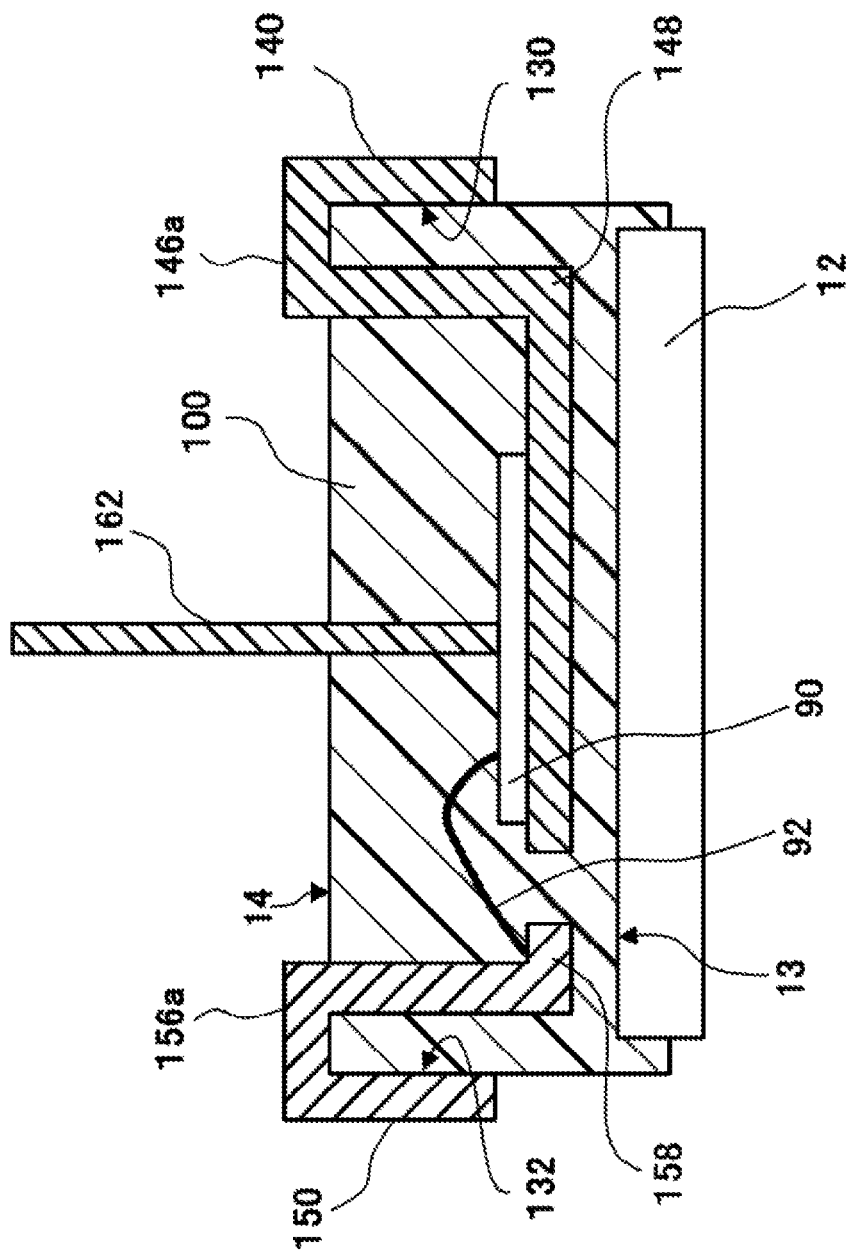
FIG. 9 is a cross-sectional view of another exemplary semiconductor module 10.

FIG. 9 is a cross-sectional view of another exemplary semiconductor module 10. In the example shown in FIG. 9, the first wire portion 148 provides a connection between the semiconductor chip 90 and the first main electrode 140 without passing through the first side surface 130 and the second side surface 132 of the body 100. The second wire portion 158 provides a connection between the wire member 92 and the first main electrode 140 without passing through the first side surface 130 and the second side surface 132 of the body 100. In the present example, the first wire portion 148 first extends toward the first side surface 130 inside the body 100 formed of resin, passes through a curved portion, and then extends toward the top surface 14. The first wire portion 148 protrudes from the body 100 at the top surface 14, extends along the top surface 14 to the first side surface 130, and connects to the first main electrode 140. The first wire portion 148 may be formed integrally with the first main electrode 140. The portion of the first wire portion 148 extending along the top surface 14 to the first side surface 130 may be used as the extending portions 146a and 146b.

The second wire portion 158 protrudes from the top surface 14 of the body 100, extends along the top surface 14 to the second side surface 132, and connects to the second main electrode 150. The portion of the second wire portion 158 that extends along the top surface 14 to the second side surface 132 may be used as the extending portions 156a and 156b. The second wire portion 158 may be formed integrally with the second main electrode 150. According to such a configuration as shown in FIG. 9, the internal structures such as substrates, internal wires, and terminals in a semiconductor module including conventional top surface electrodes can be used. Accordingly, by changing the outside portion of the body 100, the semiconductor module 10 of the present example can be used.

Figure 10:
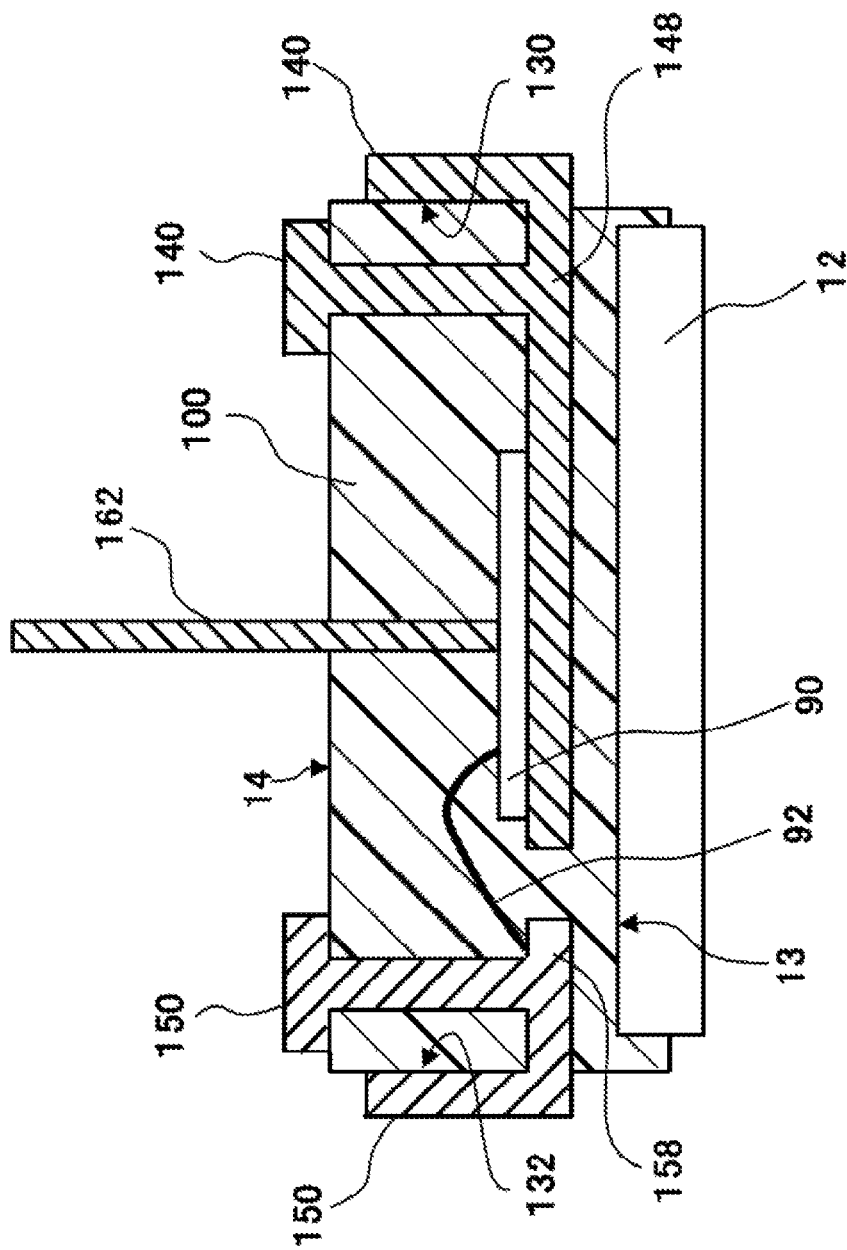
FIG. 10 is a cross-sectional view of another exemplary semiconductor module 10.

In FIG. 8 and FIG. 9, cases are shown in which the first main electrode 140 and the second main electrode 150 are also arranged on the top surface 14 of the body 100 of the semiconductor module 10. However, the semiconductor module 10 is not limited to the cases shown in FIG. 8 and FIG. 9. FIG. 10 is a cross-sectional view of another exemplary semiconductor module 10. In the example shown in FIG. 10, the first wire portion 148 includes a portion extending toward the first side surface 130 inside the body 100 and a portion extending toward the top surface 14 inside the body 100. The first wire portion 148 separately includes a portion protruding from the body 100 at the first side surface 130 and a portion protruding from the body 100 at the top surface 14. Each of these portions is connected to the first main electrode 140. The first wire portion 148 may be formed integrally with the first main electrode 140. The second wire portion 158 includes a portion extending toward the second side surface 132 inside the body 100 and a portion extending toward the top surface 14 inside the body 100. The second wire portion 158 separately includes a portion protruding from the body 100 at the second side surface 132 and a portion protruding from the body 100 at the top surface 14. Each of these portions is connected to the second main electrode 150.

Figure 11:
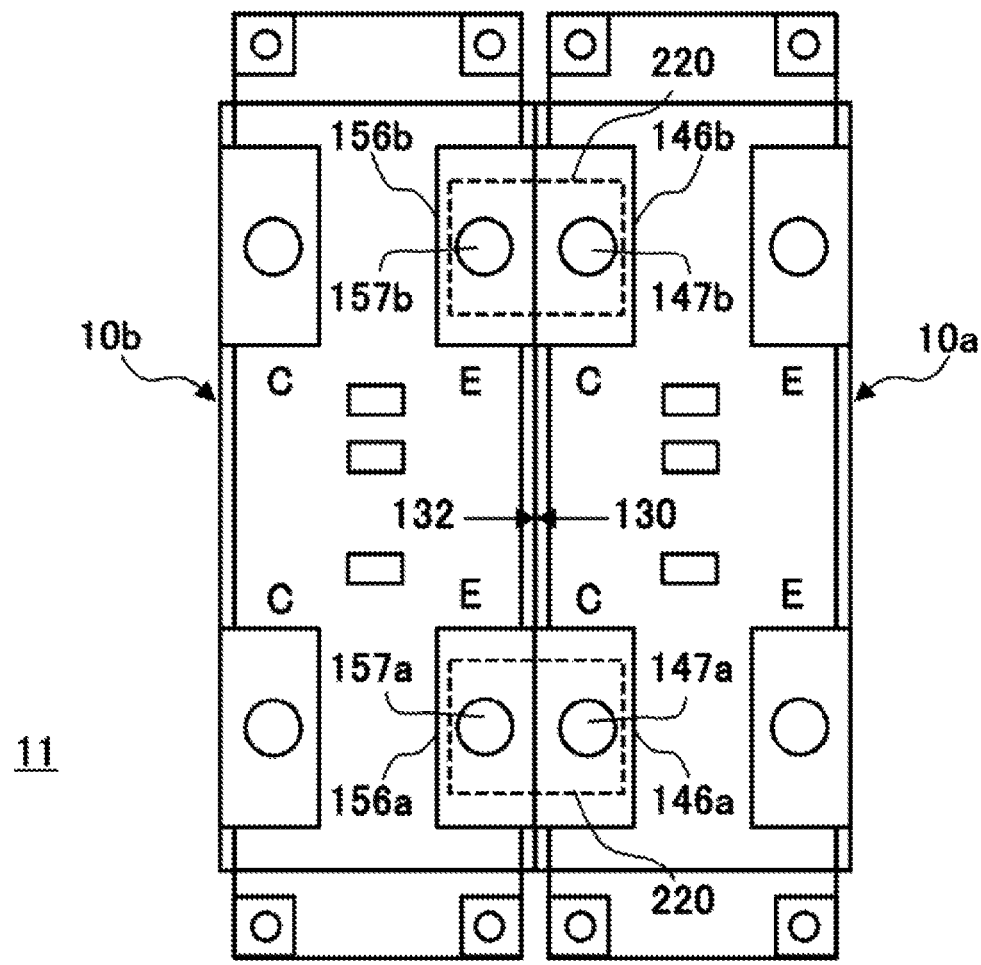
FIG. 11 is a top surface view of an exemplary semiconductor module group 11 in which a plurality of semiconductor modules 10 are arranged.

FIG. 11 is a top surface view of an exemplary semiconductor module group 11 in which a plurality of semiconductor modules 10 are arranged. In the present example, the semiconductor module group 11 is configured such that the first side surface 130 of a first semiconductor module 10a and the second side surface 132 of a second semiconductor module 10b are arranged facing each other. The first main electrode 140 (collector electrode) of the first semiconductor module 10a and the second main electrode 150 (emitter electrode) of the second semiconductor module 10b are electrically connected.

Specifically, on the top surface 14, the secure fastening portion 147a provided to the extending portion 146a of the first semiconductor module 10a and the secure fastening portion 157a provided to the extending portion 156a of the second semiconductor module 10b are electrically connected by the conductive plate 220. Similarly, on the top surface 14, the secure fastening portion 147b provided to the extending portion 146b of the first semiconductor module 10a and the secure fastening portion 157b provided to the extending portion 156b of the second semiconductor module 10b are electrically connected by the conductive plate 220.

Figure 12:
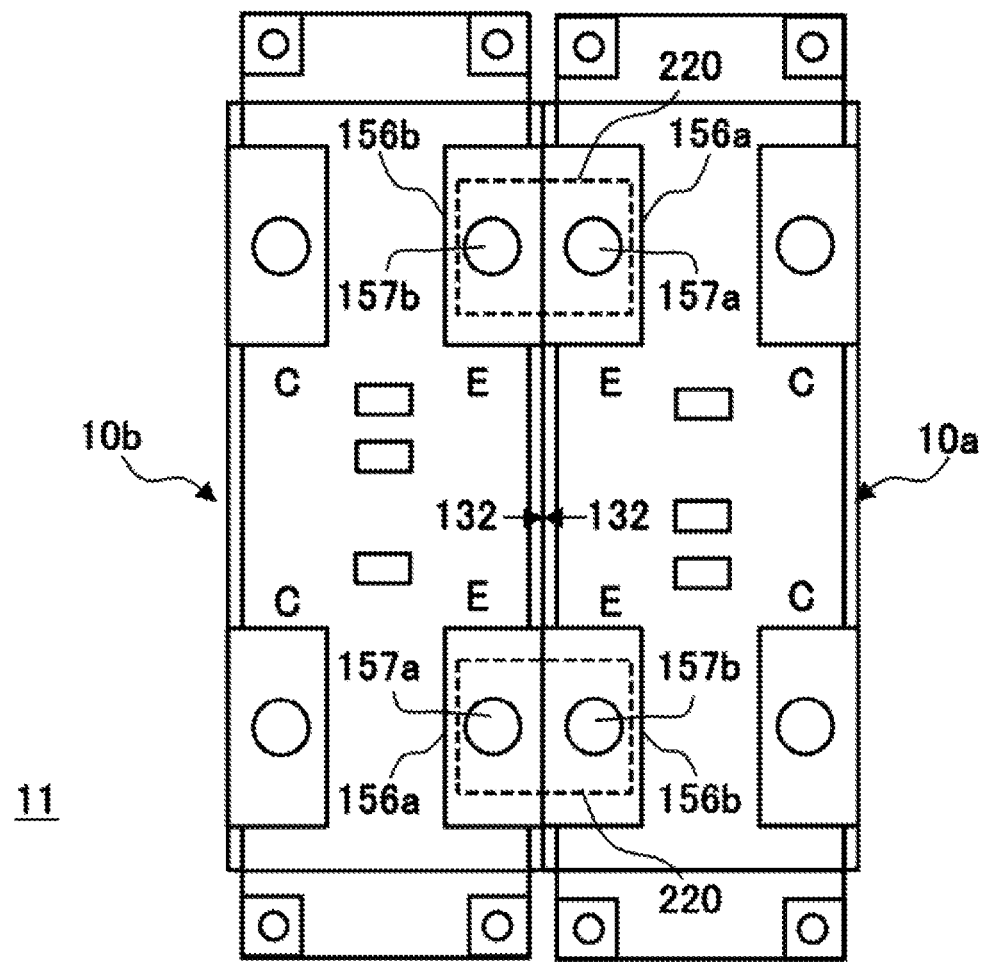
FIG. 12 is a top surface view of another exemplary semiconductor module group 11 in which a plurality of semiconductor modules 10 are arranged.

FIG. 12 is a top surface view of another exemplary semiconductor module group 11 in which a plurality of semiconductor modules 10 are arranged. The semiconductor module group 11 may be configured such that the second side surface 132 of the first semiconductor module 10a and the second side surface 132 of the second semiconductor module 10b are arranged facing each other. The second main electrode 150 (emitter electrode) of the first semiconductor module 10a and the second main electrode 150 (emitter electrode) of the second semiconductor module 10b are electrically connected.

Specifically, on the top surface 14, the secure fastening portion 157a provided to the extending portion 156a of the first semiconductor module 10a and the secure fastening portion 157b provided to the extending portion 156b of the second semiconductor module 10b are electrically connected by the conductive plate 220. Similarly, on the top surface 14, the secure fastening portion 157b provided to the extending portion 156b of the first semiconductor module 10a and the secure fastening portion 157b provided to the extending portion 156b of the second semiconductor module 10b are electrically connected by the conductive plate 220.

Unlike the linking state shown in FIG. 12, the semiconductor module group 11 may be configured such that the first side surface 130 of the first semiconductor module 10a and the first side surface 130 of the second semiconductor module 10b are arranged facing each other and the collector electrodes are linked to each other. FIG. 11 and FIG. 12 show cases where one semiconductor module group 11 is formed by arranging two semiconductor modules 10. However, the semiconductor module group 11 is not limited to such cases, and one semiconductor module group 11 may be formed by arranging three or more semiconductor modules 10.

Figure 13:
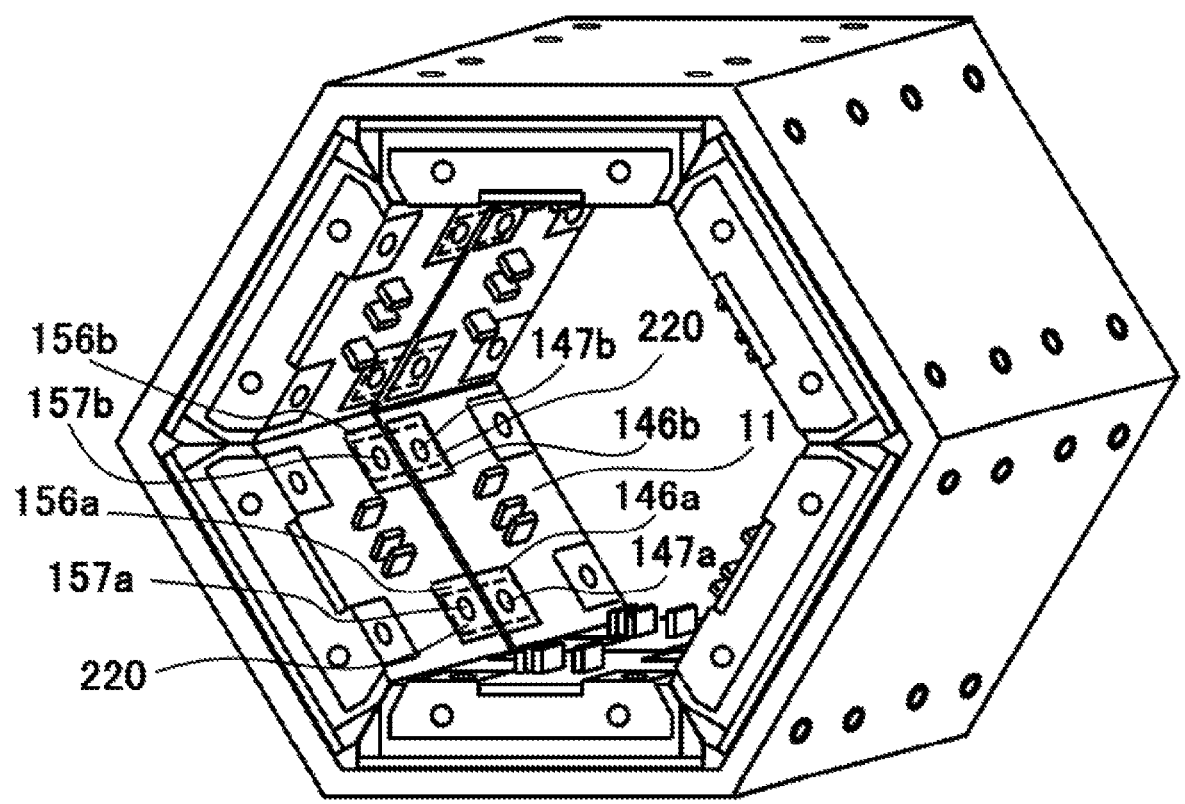
FIG. 13 shows an exemplary configuration of a power conversion apparatus 20 in which a plurality of semiconductor module groups 11 are arranged.

FIG. 13 shows an exemplary configuration of a power conversion apparatus 20 in which a plurality of semiconductor module groups 11 are arranged. As shown in FIG. 11 and FIG. 12, the first main electrode 140 and the second main electrode 150 through which the main currents flow are arranged on the top surface 14 of each semiconductor module 10 on the inside surface of the cylindrical section 21. In the present example, the extending portions 146 of the first main electrodes 140 and the extending portions 156 of the second main electrodes 150 are arranged on the top surfaces 14. The secure fastening portions 147 for linking the plurality of semiconductor modules to each other are provided to the extending portions 146 of the first main electrodes 140 on the top surfaces 14. The secure fastening portions 157 for linking the plurality of semiconductor modules to each other are provided to the extending portions 156 of the second main electrodes 150 on the top surfaces 14.

Inside the cylindrical section 21, the extending portions 146 of the first main electrodes 140 provided on the top surfaces 14 of the semiconductor modules 10 are connected to the extending portions 146 of the first main electrodes 140 or the extending portions 156 of the second main electrodes 150 provided on the top surfaces 14 of the adjacent semiconductor modules 10, by the conductive plates 220 secured to the secure fastening portions 147 and 157. The extending portions 156 of the second main electrodes 150 provided on the top surfaces 14 of the semiconductor modules 10 are connected to the extending portions 146 of the first main electrodes 140 or the extending portions 156 of the second main electrodes 150 provided on the top surfaces of adjacent semiconductor modules 10, by the conductive plates 220 secured to the secure fastening portions 147 and 157.

In the example shown in FIG. 13, each semiconductor module group 11 may have the configuration shown in FIG. 11 and FIG. 12. Each semiconductor module group 11 is formed by arranging a plurality of semiconductor modules 10 in the axial direction of the cylindrical section 21, such that the first side surface 130 of a semiconductor module faces the first side surface 130 or the second side surface 132 of another adjacent semiconductor module. In the present example, two semiconductor modules 10 are arranged to form one semiconductor module group 11.

The cylindrical section 21 is formed by arranging a plurality of semiconductor module groups 11 in a manner to surround a predetermined position. In the present example, six semiconductor module groups 11 are arranged. Aside from forming the cylindrical section 21 from the plurality of semiconductor module groups 11, the configuration of the present example is similar to the configuration of the power conversion apparatus 20 shown in FIG. 2 to FIG. 4. Accordingly, repetitive descriptions are omitted.

As described above, by forming the semiconductor module group 11 in which a plurality of semiconductor modules 10 are arranged, it is possible to connect the semiconductor modules 10 in parallel to increase the capacity of the power conversion apparatus 20, for example, without increasing the diameter of the cylindrical section 21.

Figure 14:
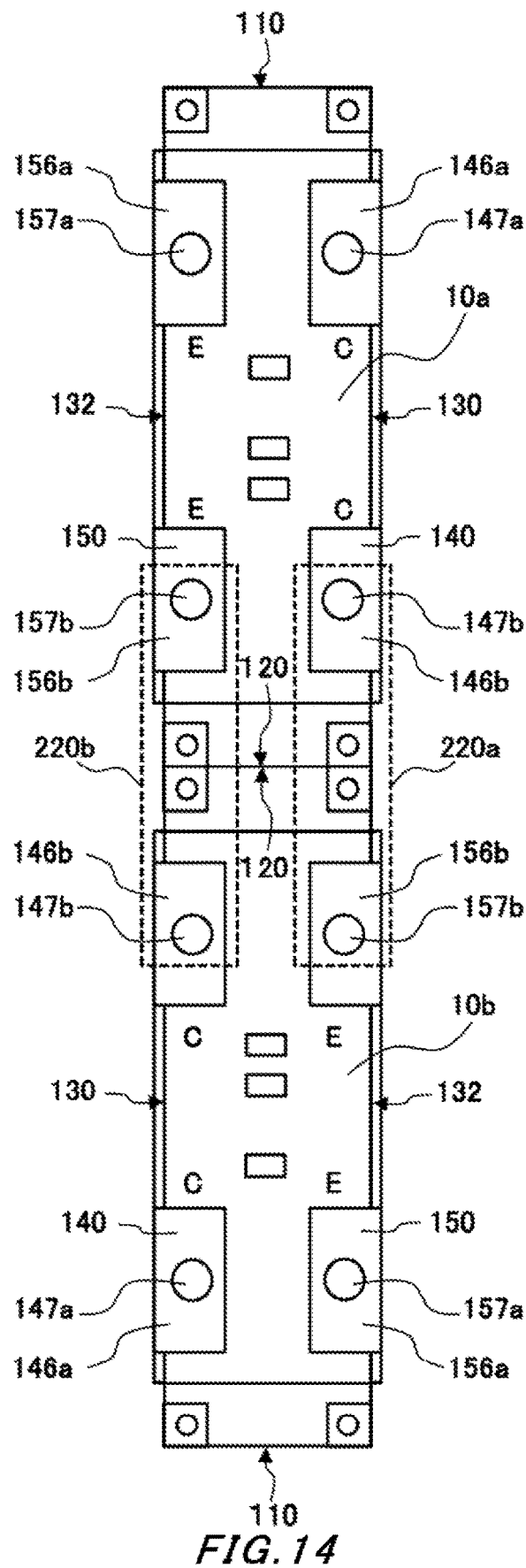
FIG. 14 is a top surface view of another example of linking a plurality of semiconductor modules 10.

FIG. 14 is a top surface view of another example of linking a plurality of semiconductor modules 10. The semiconductor modules 10 may be arranged such that an end portion of the fourth side surface 120 of the first semiconductor module 10a faces an end portion of the fourth side surface 120 of the second semiconductor module 10b. The first main electrode 140 (collector electrode) of the first semiconductor module 10a and the second main electrode 150 (emitter electrode) of the second semiconductor module 10b are electrically connected. Specifically, on the top surfaces 14, the secure fastening portion 147b provided to the extending portion 146b of the first semiconductor module 10a and the secure fastening portion 157b provided to the extending portion 156b of the second semiconductor module 10b are electrically connected by the conductive plate 220a.

Furthermore, the second main electrode 150 (emitter electrode) of the first semiconductor module 10a and the first main electrode 140 (collector electrode) of the second semiconductor module 10b are electrically connected. Specifically, on the top surfaces 14, the secure fastening portion 157b provided to the extending portion 156b of the first semiconductor module 10a and the secure fastening portion 147b provided to the extending portion 146b of the second semiconductor module 10b are electrically connected by the conductive plate 220b.

Figure 15:
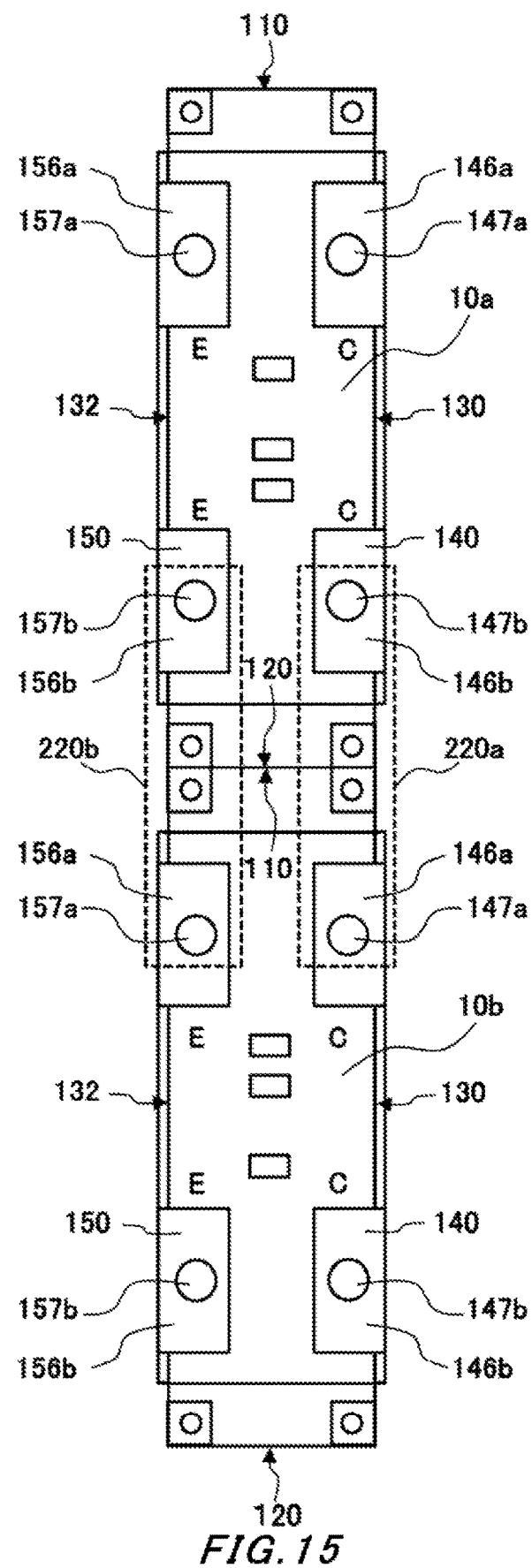
FIG. 15 is a top surface view of another linking example of a plurality of semiconductor modules 10.

FIG. 15 is a top surface view of another linking example of a plurality of semiconductor modules 10. The semiconductor modules 10 may be arranged such that the end portion of the fourth side surface 120 of the first semiconductor module 10a and the end portion of the third side surface 110 of the second semiconductor module 10b face each other. The first main electrode 140 (collector electrode) of the first semiconductor module 10a and the first main electrode 140 (collector electrode) of the second semiconductor module 10b are electrically connected. Specifically, on the top surfaces 14, the secure fastening portion 147b provided to the extending portion 146b of the first semiconductor module 10a and the secure fastening portion 147a provided to the extending portion 146a of the second semiconductor module 10b are electrically connected by the conductive plate 220a.

Furthermore, the second main electrode 150 (emitter electrode) of the first semiconductor module 10a and the second main electrode 150 (emitter electrode) of the second semiconductor module 10b are electrically connected. Specifically, on the top surfaces 14, the secure fastening portion 157b provided to the extending portion 156b of the first semiconductor module 10a and the secure fastening portion 157a provided to the extending portion 156a of the second semiconductor module 10b are electrically connected by the conductive plate 220b.

In FIG. 14 and FIG. 15, the adjacent semiconductor modules 10 may be linked in a plane. On the other hand, the cylindrical section 21 may be formed by arranging the plurality of semiconductor modules 10 to surround a predetermined position, such that the third side surface 110 of a semiconductor module 10 faces the third side surface 110 or the fourth side surface 120 of another adjacent semiconductor module 10.

Figure 16:
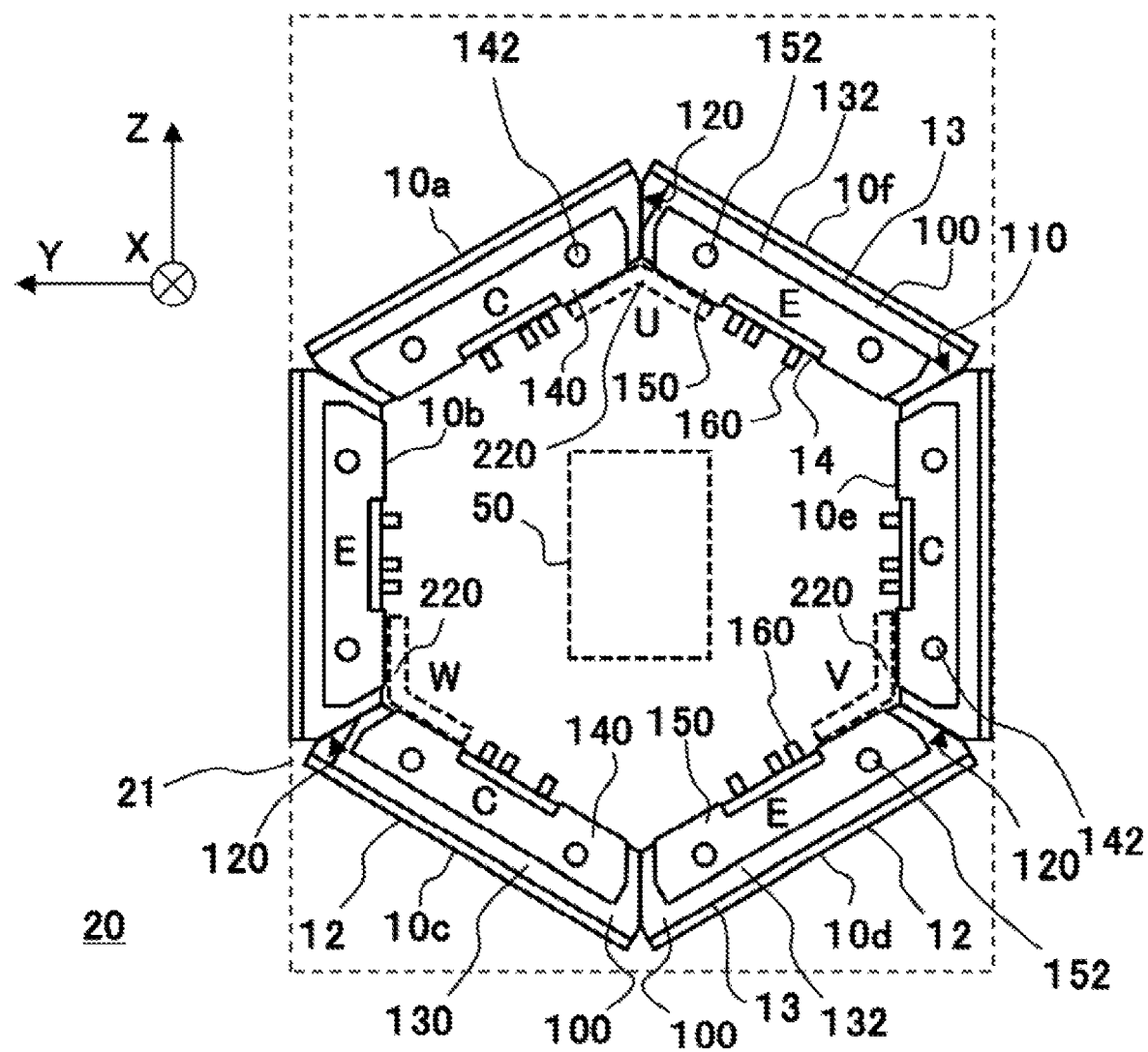
FIG. 16 shows another exemplary configuration of the power conversion apparatus 20.

FIG. 16 shows another exemplary configuration of the power conversion apparatus 20. FIG. 16 is a view of the power conversion apparatus 20 from the second ring-shaped end surface 24. In a similar manner as the configuration shown in FIG. 3, in the power conversion apparatus 20 shown in FIG. 16, the cylindrical section 21 is formed by arranging the plurality of semiconductor modules 10 to surround a predetermined position, such that the third side surface 110 of a semiconductor module 10 faces the third side surface 110 or the fourth side surface 120 of another adjacent semiconductor module 10.

In the configuration shown in FIG. 3, adjacent semiconductor modules 10 are linked to each other by securing the plates 215, 216, and 217 to the plate fastening portions 142 and 152 on the second ring-shaped end surface 24. In contrast to this, in the example shown in FIG. 16, the first main electrodes 140 and the second main electrodes 150 are arranged on the top surface 14 of each semiconductor module 10 as well, on the inner surface of the cylindrical section 21. Secure fastening portions 147 and 157 for linking the plurality of semiconductor modules 10 to each other are provided respectively to the first main electrodes 140 and the second main electrodes 150 on the top surfaces 14. Also, on the inside of the cylindrical section 21, the first main electrodes 140 provided on the top surfaces 14 of the semiconductor modules 10 are connected to the first main electrodes 140 or second main electrodes 150 provided on the top surfaces 14 of adjacent semiconductor modules 10, by conductive plates 220 secured to the secure fastening portions 147 and 157. The second main electrodes 150 provided on the top surfaces 14 of the semiconductor modules 10 are connected to the first main electrodes 140 or second main electrodes 150 provided on the top surfaces 14 of adjacent semiconductor modules 10, by conductive plates 220 secured to the secure fastening portions 147 and 157.

The top surfaces 14 of adjacent semiconductor modules 10 are not parallel, and instead form a predetermined angle according to the tapers of the third side surfaces 110 and the fourth side surfaces 120. In the present example, the top surfaces 14 of adjacent semiconductor modules 10 form an angle of 120 degrees. Accordingly, the conductive plates 220 may also be curved to form the predetermined angle.

Instead of the plates 215, 216, and 217 secured to the plate fastening portions 142 and the plate fastening portions 152 formed on the first ring-shaped end surface 22 or the second ring-shaped end surface 24, the first main electrodes 140 and the second main electrodes 150 are linked by conductive plates secured to the secure fastening portions 147 and the secure fastening portions 157 formed on the inner surface of the cylindrical section 21, but aside from this point, the rest of the configuration is similar to the configuration shown in FIG. 3. Accordingly, repetitive descriptions are omitted. In the example shown in FIG. 16, the plate fastening portions 142 and 152 on the first ring-shaped end surface 22 and the second ring-shaped end surface 24 may be omitted.

As described above, the semiconductor module 10 of the present embodiment includes the secure fastening portions 147 and the secure fastening portions 157 on the top surface 14 of the body 100 as well, and the first main electrodes 140 and second main electrodes 150 have shapes with linear symmetry. Accordingly, various planar linkage states and various ring-shaped linkage states can be realized.

The above describes a case in which, in the semiconductor module 10, the lengths of the first side surface 130 and the second side surface 132 along a direction parallel to the top surface 14 are greater than each width of the third side surface 110 and the fourth side surface 120 in the direction parallel to the top surface 14. However, the semiconductor module 10 is not limited to such a case.

Figure 17:
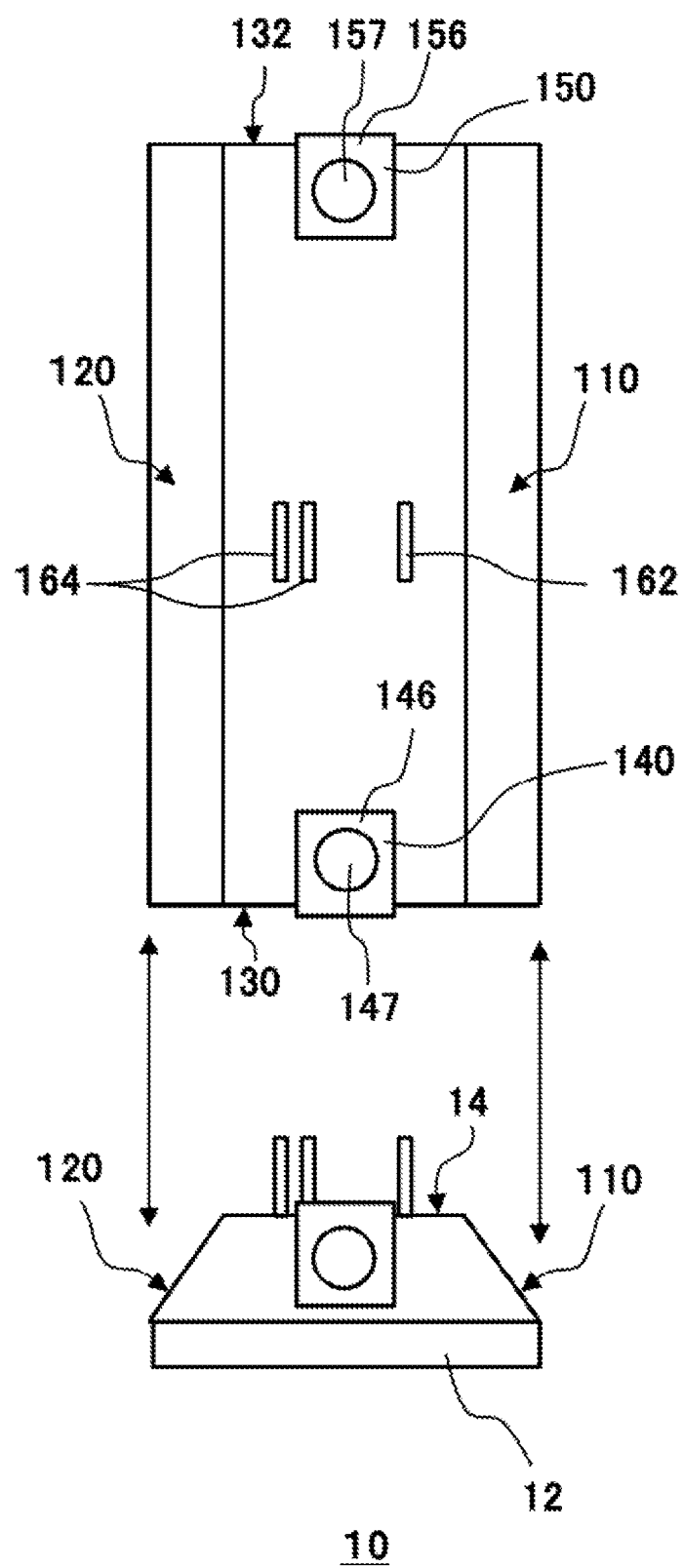
FIG. 17 shows another example of the semiconductor module 10.

FIG. 17 shows another example of the semiconductor module 10. The upper portion in FIG. 17 is a top surface view, and the bottom portion is a side surface view. In the semiconductor module 10 of the present example, the lengths of the first side surface 130 and the second side surface 132 in the direction parallel to the top surface 14 are less than each width of the third side surface 110 and the fourth side surface 120 in the direction parallel to the top surface 14. Accordingly, when forming the cylindrical section 21 described in FIG. 2 and FIG. 3 using a plurality of the semiconductor modules 10 shown in FIG. 17, it is possible to reduce the diameters of the first ring-shaped end surface 22 and the second ring-shaped end surface 24 in FIG. 2 and FIG. 3.

Furthermore, according to the example shown in FIG. 17, the first main electrode 140 may include the extending portion 146 that extends above the top surface 14 of the body 100. At least one secure fastening portion 147 may be formed on the extending portion 146. In the present example, there is one extending portion 146, and there is also one secure fastening portion 147 provided to the extending portion 146. Similarly, the second main electrode 150 also includes an extending portion 156 and a secure fastening portion 157. The remaining configuration is similar to that of the semiconductor module 10 shown in FIG. 2 and FIG. 3 above. Accordingly, repetitive descriptions are omitted.

The power conversion apparatus 20 described using FIG. 1 to FIG. 4 includes six semiconductor modules 10. Furthermore, the power conversion apparatus 20 described using FIG. 13 includes six semiconductor module groups 11. The cylindrical section 21 formed by the plurality of semiconductor modules 10 has a hexagonal shape, as seen from the direction perpendicular to the end surface. However, the power conversion apparatus is not limited to such a shape.

Figure 18:
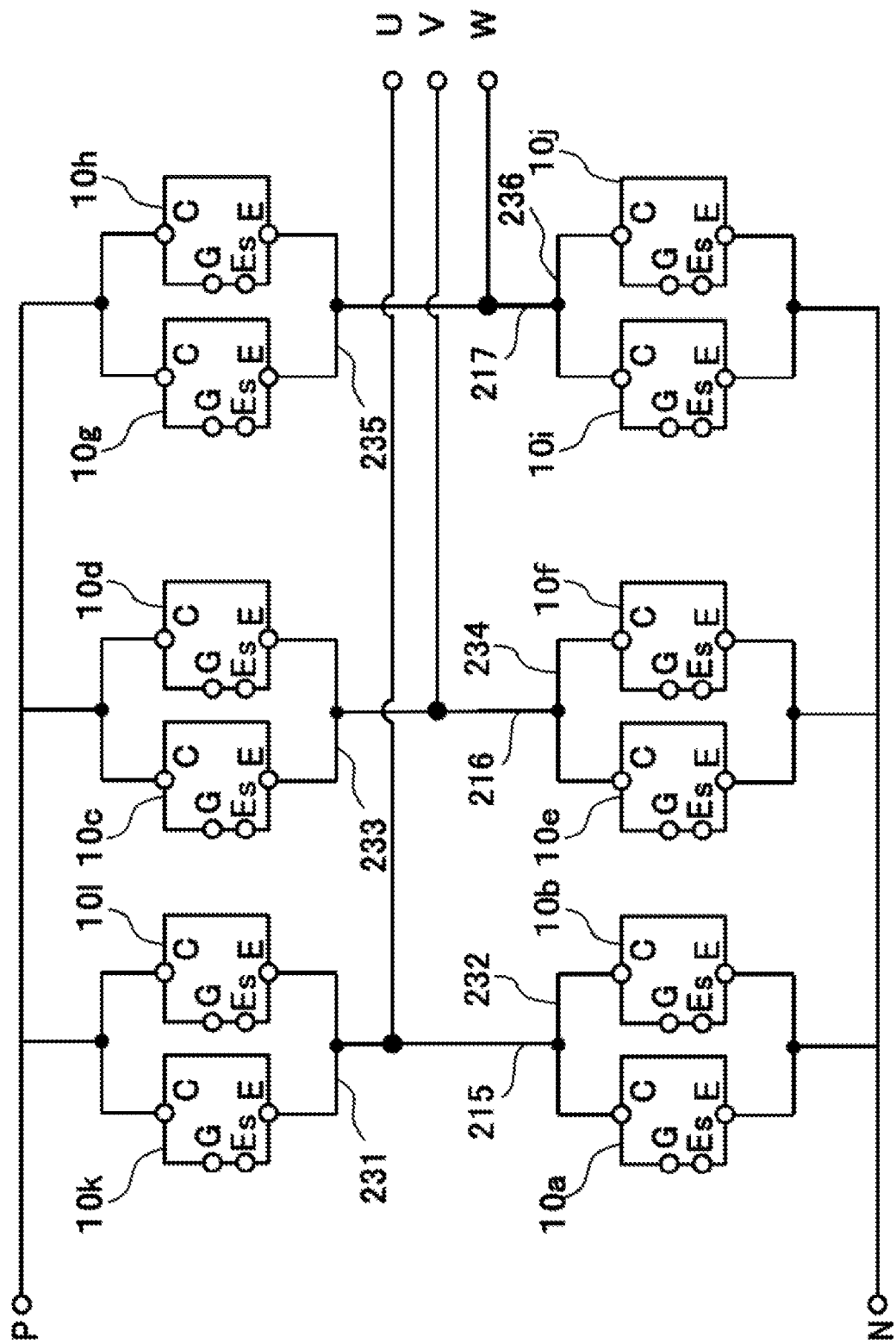
FIG. 18 shows an exemplary circuit configuration of the power conversion apparatus 20 in a case where two semiconductor modules 10 are connected in parallel.

FIG. 18 shows an exemplary circuit configuration of the power conversion apparatus 20 in a case where two semiconductor modules 10 are connected in parallel. In the present example, a semiconductor module 10a and a semiconductor module 10b are connected in parallel. Specifically, the collector terminals of the semiconductor module 10a and the semiconductor module 10b are electrically connected to each other, and the emitter terminals of the semiconductor module 10a and the semiconductor module 10*b* are electrically connected to each other. Similarly, such a parallel connection is formed between a semiconductor module 10*c* and a semiconductor module 10*d*, between a semiconductor module 10*e* and a semiconductor module 10*f*, between a semiconductor module 10*g* and a semiconductor module 10*h*, between a semiconductor module 10*i* and a semiconductor module 10*j*, and between a semiconductor module 10*k* and a semiconductor module 10*l*.

The circuit configuration in each semiconductor module 10 may be similar to the circuit configuration shown in FIG. 5. The emitter terminals of the pair of semiconductor modules 10*k* and 10*l* connected in parallel and the collector terminals of the pair of semiconductor modules 10*a* and 10*b* connected in parallel are electrically connected to form the U terminal of the three-phase AC terminal. Similarly, the V terminal and the W terminal are each formed by connecting the connector terminals of a pair of semiconductor modules 10 connected in parallel and the emitter terminals of another pair of semiconductor modules connected in parallel.

Figure 19:
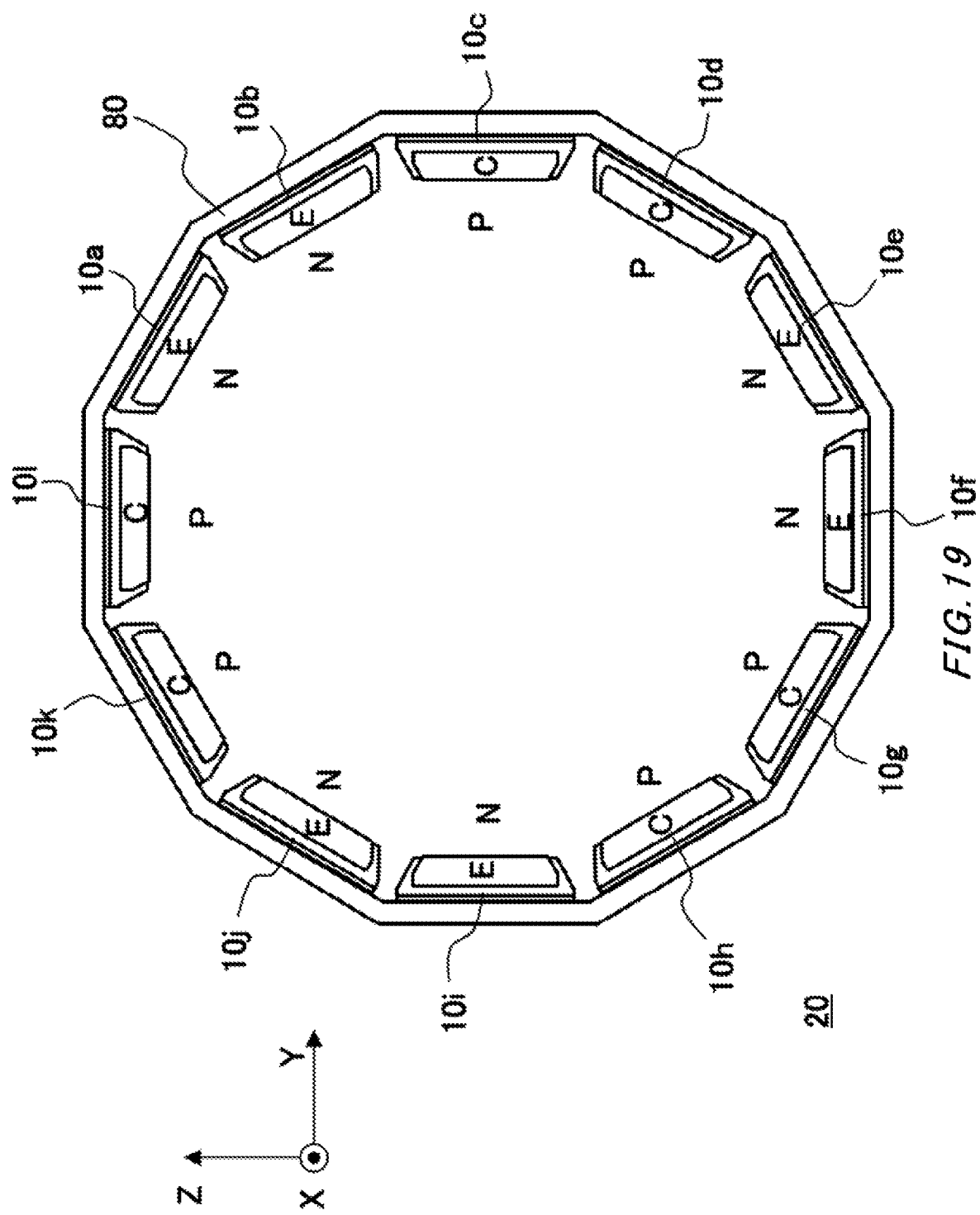
FIG. 19 is a view of the power conversion apparatus 20 in a case where two semiconductor modules 10 are connected in parallel, as seen from the first ring-shaped end surface.
Figure 20:
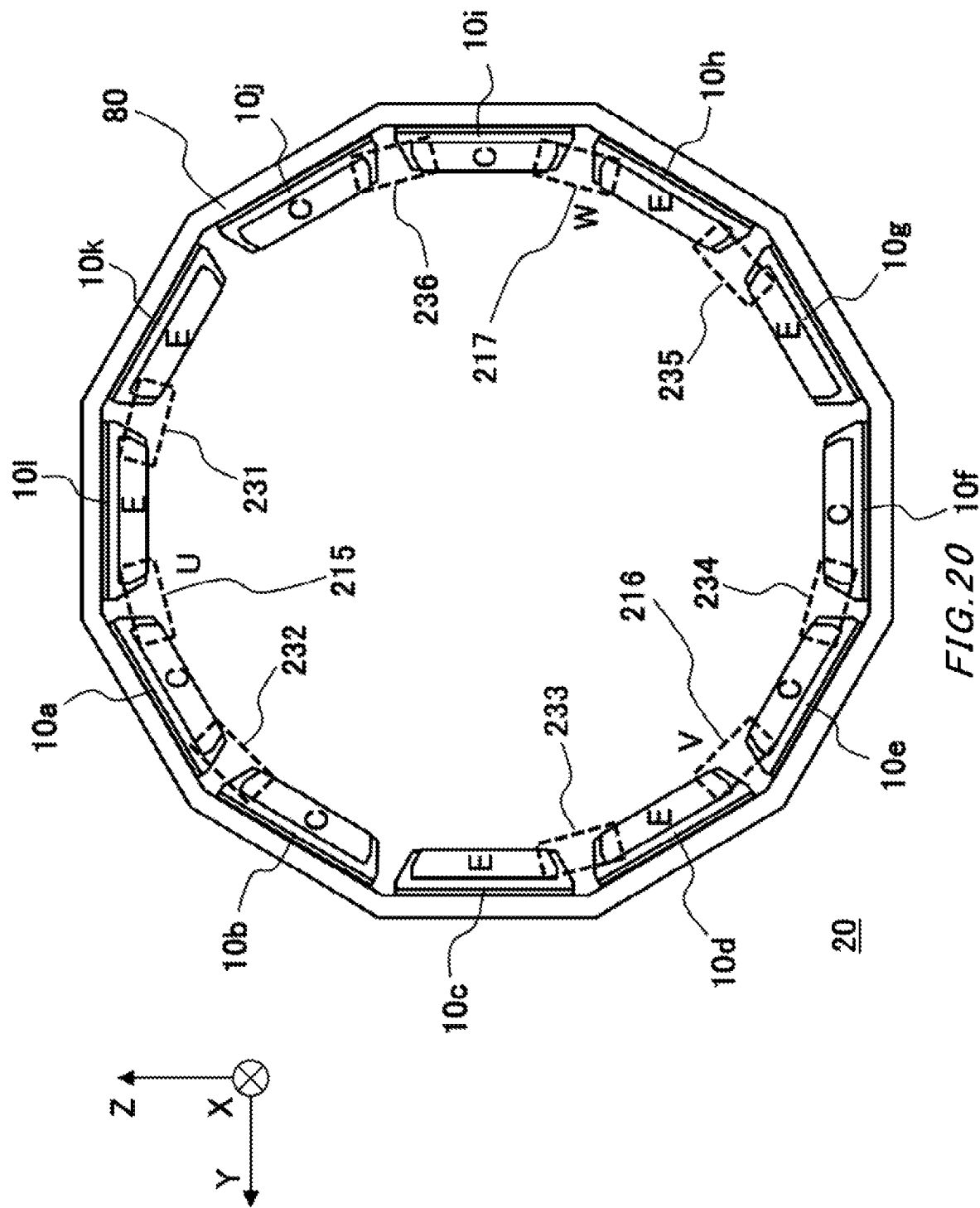
FIG. 20 is a view of the power conversion apparatus 20 in a case where two semiconductor modules 10 are connected in parallel, as seen from the second ring-shaped end surface.

FIG. 19 is a view of the power conversion apparatus 20 in a case where two semiconductor modules 10 are connected in parallel, as seen from the first ring-shaped end surface 22. FIG. 20 is a view of the power conversion apparatus 20 in a case where two semiconductor modules 10 are connected in parallel, as seen from the second ring-shaped end surface 24. FIG. 19 corresponds to FIG. 2 in the first embodiment, and FIG. 20 corresponds to FIG. 3.

In FIG. 19 and FIG. 20, the collector electrodes that are the first main electrodes 140 are shown by "C", and the emitter electrodes that are the second main electrodes 150 are shown by "E". The first main electrodes 140 are provided on the first side surfaces 130. The second main electrodes 150 are provided on the second side surfaces 132. In FIG. 19 and FIG. 20, the reference numbers of the first side surfaces 130 and the second side surfaces 132 are not shown.

According to the power conversion apparatus 20 of the present example, twelve semiconductor modules 10*a* to 10*l* are arranged surrounding a predetermined position. In this way, the space inside the cylindrical section 21 is formed. In the case where twelve semiconductor modules 10 are included in the power conversion apparatus 20, the cylindrical section 21 may have a dodecagon shape, as seen from the direction perpendicular to the end surface. Furthermore, the inner shape of the outer heat dissipating portion 80 may be a dodecagon, as seen from the direction perpendicular to the end surface. Each base plate 12 of the plurality of semiconductor modules 10*a* to 10*l* may be secured to the outer heat dissipating portion 80.

As shown in FIG. 19, a total of six sets of semiconductor module 10 pairs, in which the semiconductor modules 10 are connected to each other in parallel such as shown in the circuit diagram of FIG. 18, are formed on the first ring-shaped end surface 22 positioned on the input power source side. In three of the semiconductor module 10 pairs among the six pairs, the semiconductor modules 10 in the pair are arranged such that the first main electrodes 140 (collector electrodes) are adjacent to each other on the first ring-shaped end surface 22. On the other hand, in the remaining three semiconductor module 10 pairs, the semiconductor modules 10 are arranged such that the second main electrodes 150 (emitter electrodes) are adjacent to each other on the first ring-shaped end surface 22.

The semiconductor module 10 pairs in which the first main electrodes 140 (collector electrodes) are adjacent to each other and the semiconductor module 10 pairs in which the second main electrodes 150 (emitter electrodes) are adjacent to each other are arranged in an alternating manner along the circumferential direction. As shown in FIG. 20, the remaining electrodes among the plurality of first main electrodes 140 and the plurality of second main electrodes 150 are arranged on the second ring-shaped end surface 24 of the cylindrical section 21. Accordingly, semiconductor module 10 pairs in which the first main electrodes 140 (collector electrodes) are adjacent to each other and the semiconductor module 10 pairs in which the second main electrodes 150 (emitter electrodes) are adjacent to each other are arranged in an alternating manner along the circumferential direction. In other words, the first main electrodes 140 (collector electrodes) and the second main electrodes 150 (emitter electrodes) may be arranged in sets of two in an alternating manner, on at least one of the first ring-shaped end surface 22 and the second ring-shaped end surface 24.

On the first ring-shaped end surface 22, each first main electrode (collector electrode) C may be a positive electrode terminal P connected to a positive electrode of the input power source 30. Each second main electrode (emitter electrode) E may be a negative electrode terminal N connected to a negative electrode of the input power source 30. The positive electrode terminals connected to the positive electrode of the input power source 30 and the negative electrode terminals connected to the negative electrode of the input power source are included on the first ring-shaped end surface 22.

On the second ring-shaped surface 24 shown in FIG. 20, the second main electrodes 150 (emitter electrodes) of the adjacent semiconductor modules 10*k* and 10*l* are electrically connected by a parallel connection plate 231. The parallel connection plate 231 may be formed of a conductive material such as metal. The parallel connection plate 231 is secured to the plate fastening portions 152 and the plate fastening portions 142. Since six pairs are to be created, a total of six parallel connection plates 231 to 236 are provided. The pair of semiconductor modules 10*a* and 10*b* whose first main electrodes 140 (collector electrodes) are adjacent and the pair of semiconductor modules 10*k* and 10*l* whose second main electrodes 150 (emitter electrodes) are adjacent are linked by the plate 215.

The plate 215 may be secured to the plate fastening portions 142 and the plate fastening portions 152. Two plate fastening portions 142 may be provided to each first main electrode 140. Similarly, two plate fastening portions 152 may be provided to each second main electrode 150. In this way, according to the configuration in which two semiconductor modules are connected in parallel, it is possible to increase the capacity of the power conversion apparatus 20. It should be noted that n (where n is a positive integer) semiconductor modules 10 may be connected to each other in parallel. In this case, the first main electrodes 140 and the second main electrodes 150 may be arranged in sets of n (where n is a positive integer) in an alternating manner, on at least one of the first ring-shaped end surface 22 and the second ring-shaped end surface 24. Here, n may be greater than or equal to 3.

The semiconductor module 10 itself can be used as a module in a similar manner as the modules described in FIG. 6 to FIG. 8 in the first embodiment. Accordingly, the semiconductor modules can be shared.

Figure 21:
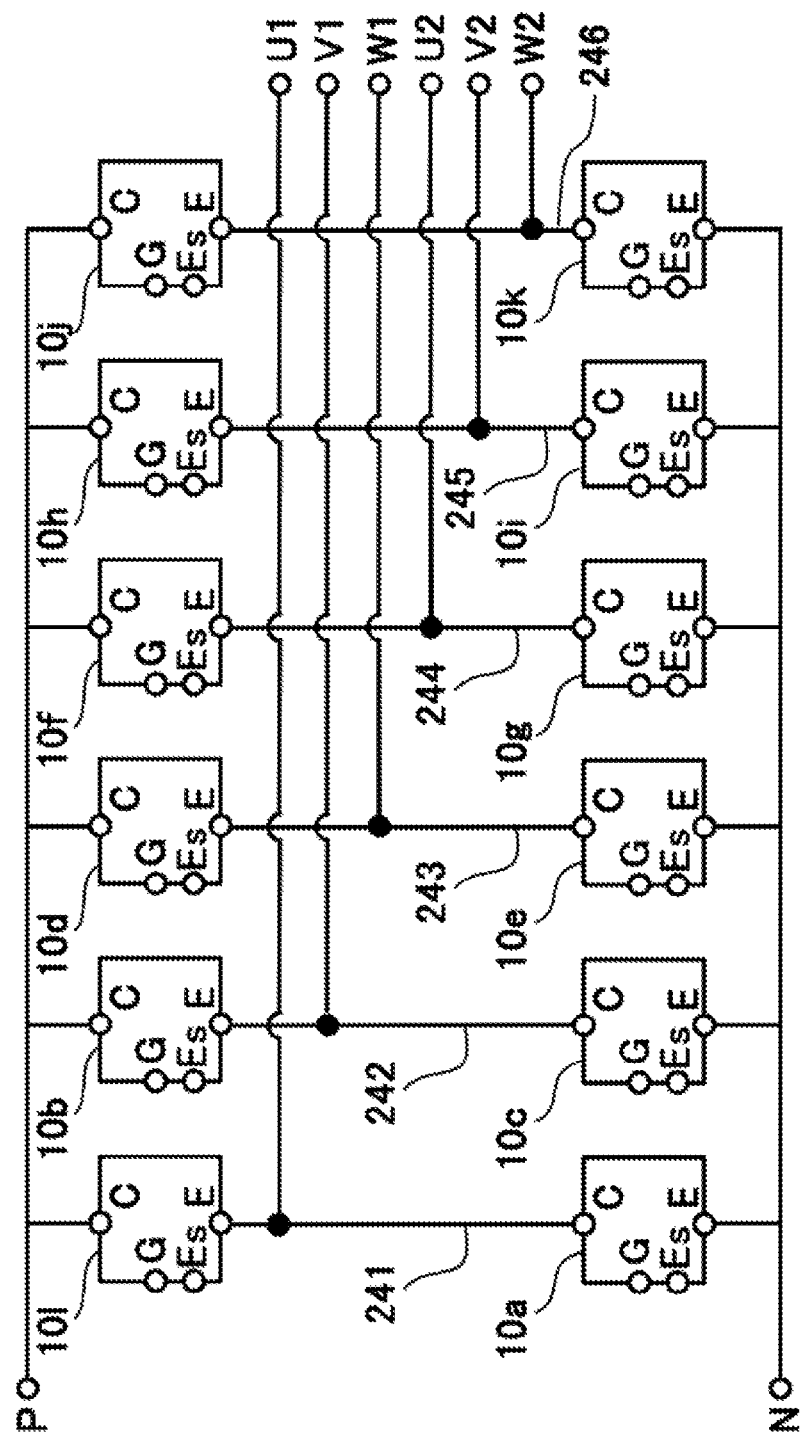
FIG. 21 shows an exemplary circuit configuration of the power conversion apparatus 20 having two sets of three-phase AC output terminals.

FIG. 21 shows an exemplary circuit configuration of the power conversion apparatus 20 having two sets of three-phase AC output terminals. In the power conversion apparatus 20 shown in FIG. 21, the number of semiconductor modules 10 is six, and not three. The number of semiconductor modules 10*l*, 10*b*, 10*d*, 10*f*, 10*h*, and 10*j* forming the upper arm circuit is six. Similarly, the number of semiconductor modules 10a, 10c, 10e, 10g, 10i, and 10k forming the lower arm circuit is six. Accordingly, it is possible to provide two sets (two slots) of terminals for three-phase AC output, as the three-phase AC output terminal Specifically, a U1 terminal, a V1 terminal, a W1 terminal, a U2 terminal, a V2 terminal, and a W2 terminal are provided as the three-phase AC output terminals. Aside from this point, the circuit configuration is the same as the case shown in FIG. 5.

Figure 22:
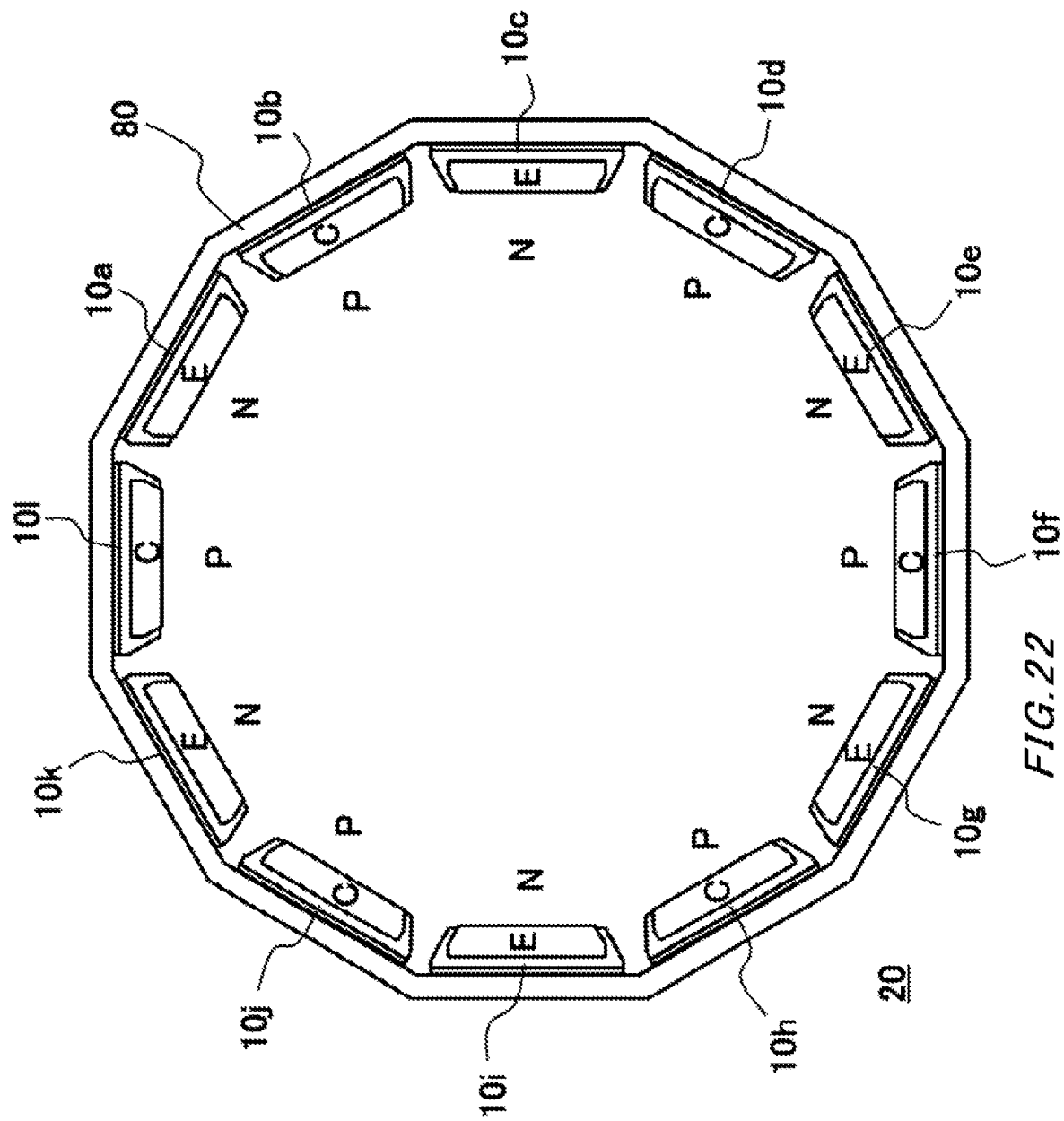
FIG. 22 is a view of the power conversion apparatus 20 including the two sets of three-phase AC output terminals, as seen from the first ring-shaped end surface.
Figure 23:
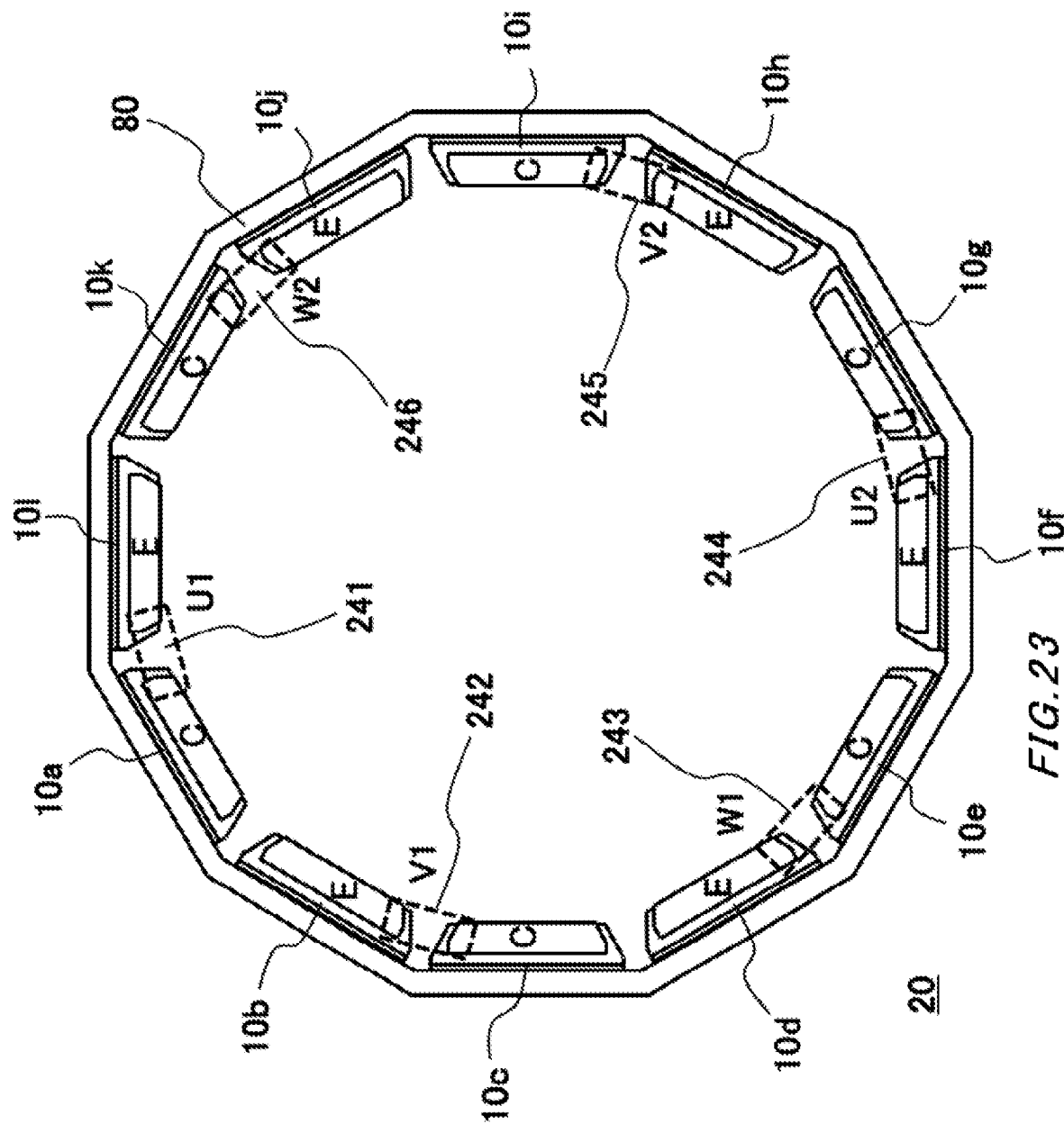
FIG. 23 is a view of the power conversion apparatus 20 including the two sets of three-phase AC output terminals, as seen from the second ring-shaped end surface.

FIG. 22 is a view of the power conversion apparatus 20 including the two sets of three-phase AC output terminals, as seen from the first ring-shaped end surface. FIG. 23 is a view of the power conversion apparatus 20 including the two sets of three-phase AC output terminals, as seen from the second ring-shaped end surface. In FIG. 22 and FIG. 23, the collector electrodes that are the first main electrodes 140 are shown by "C", and the emitter electrodes that are the second main electrodes 150 are shown by "E". As shown in FIG. 22, the first main electrodes 140 (collector electrodes) of the semiconductor modules 10b, 10d, 10f, 10h, 10j, and 10l and the second main electrodes 150 (emitter electrodes) of the semiconductor modules 10a, 10c, 10e, 10g, 10i, and 10k are arranged one at a time in an alternating manner along the circumferential direction, on the first ring-shaped end surface 22 of the cylindrical section 21.

As shown in FIG. 23, the first main electrodes 140 (collector electrodes) of the semiconductor modules 10a, 10c, 10e, 10g, 10i, and 10k and the second main electrodes 150 (emitter electrodes) of the semiconductor modules 10b, 10d, 10f, 10h, 10j, and 10l are arranged one at a time in an alternating manner along the circumferential direction, on the second ring-shaped end surface 24.

In the present example, the power conversion apparatus 20 includes a plurality of plates 241 to 246. Each plate may be formed of a conductive material. As shown in FIG. 23, the first main electrode 140 (collector electrode C) of the semiconductor module 10a and the second main electrode 150 (emitter electrode E) of the semiconductor module 10l are electrically connected to each other by the plate 241. The second main electrode 150 (emitter electrode) of the semiconductor module 10b and the first main electrode 140 (collector electrode) of the semiconductor module 10c are electrically connected to each other by the plate 242. Similarly, the second main electrode 150 (emitter electrode) of the semiconductor module 10d and the first main electrode (collector electrode) of the semiconductor module 10e are electrically connected to each other by the plate 243.

Similarly, the second main electrode 150 (emitter electrode) of the semiconductor module 10f and the first main electrode 140 (collector electrode) of the semiconductor module 10g are electrically connected to each other by the plate 244. The second main electrode 150 (emitter electrode) of the semiconductor module 10h and the first main electrode 140 (collector electrode) of the semiconductor module 10i are electrically connected to each other by the plate 245. The second main electrode 150 (emitter electrode) of the semiconductor module 10j and the first main electrode 140 (collector electrode) of the semiconductor module 10k are electrically connected to each other by the plate 246. Each connection point corresponds to a terminal in the two sets of three-phase AC outputs.

Accordingly, even in a case where the motor apparatus 40 has a multi-slot configuration, it is possible to apply the power conversion apparatus shown in FIG. 21 to FIG. 23 thereto. Furthermore, it is possible to reduce the circuit inductance by arranging the U1 terminal, the V1 terminal, the W1 terminal, the U2 terminal, the V2 terminal, and the W2 terminal as shown in FIG. 22 and FIG. 23.

In the present embodiment described above, a device that converts DC power into three-phase AC power is described as the power conversion apparatus 20, but the power conversion apparatus of the present invention is not limited to such a case. The power conversion apparatus may be a circuit, referred to as a matrix converter, that receives input of three-phase AC power, and performs an adjustment to convert this power into adjusted three-phase AC power.

Figure 24:
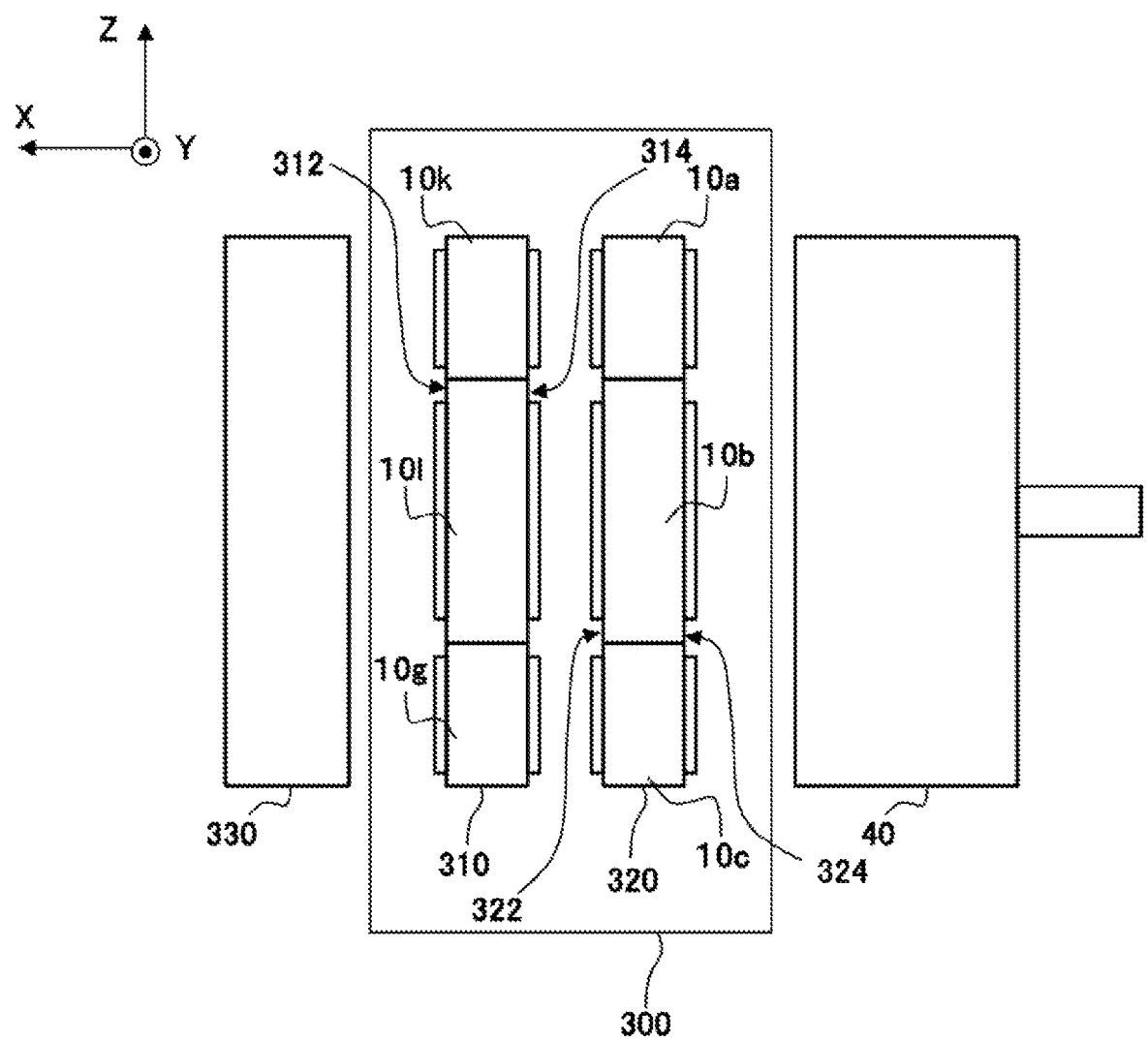
FIG. 24 shows a case in which a power conversion apparatus 300 that is a matrix converter is applied to a motor drive system 4.

FIG. 24 shows a case in which a power conversion apparatus 300 that is a matrix converter is applied to a motor drive system 4. The motor drive system 4 is an example of a system using the power conversion apparatus 300. The motor drive system 4 includes the power conversion apparatus 300, an AC input power supply 330, and the motor apparatus 40. The power conversion apparatus 300 is a matrix converter than converts AC power input thereto into different AC power.

The power conversion apparatus 300 includes a first inverter section 310 and a second inverter section 320. The first inverter section 310 is provided closer to the AC input power supply 330 than the second inverter section 320. The first inverter section 310 and the second inverter section 320 may each have the same configuration as the power conversion apparatus 20 described in FIG. 2 to FIG. 5. The first inverter section 310 and the second inverter section 320 may each be formed as a cylindrical section in which a plurality of semiconductor modules are arranged to surround a predetermined position. Accordingly, the power conversion apparatus 300 may have a configuration in which a plurality of cylindrical sections are linked in the axial direction of the cylinders.

Figure 25:
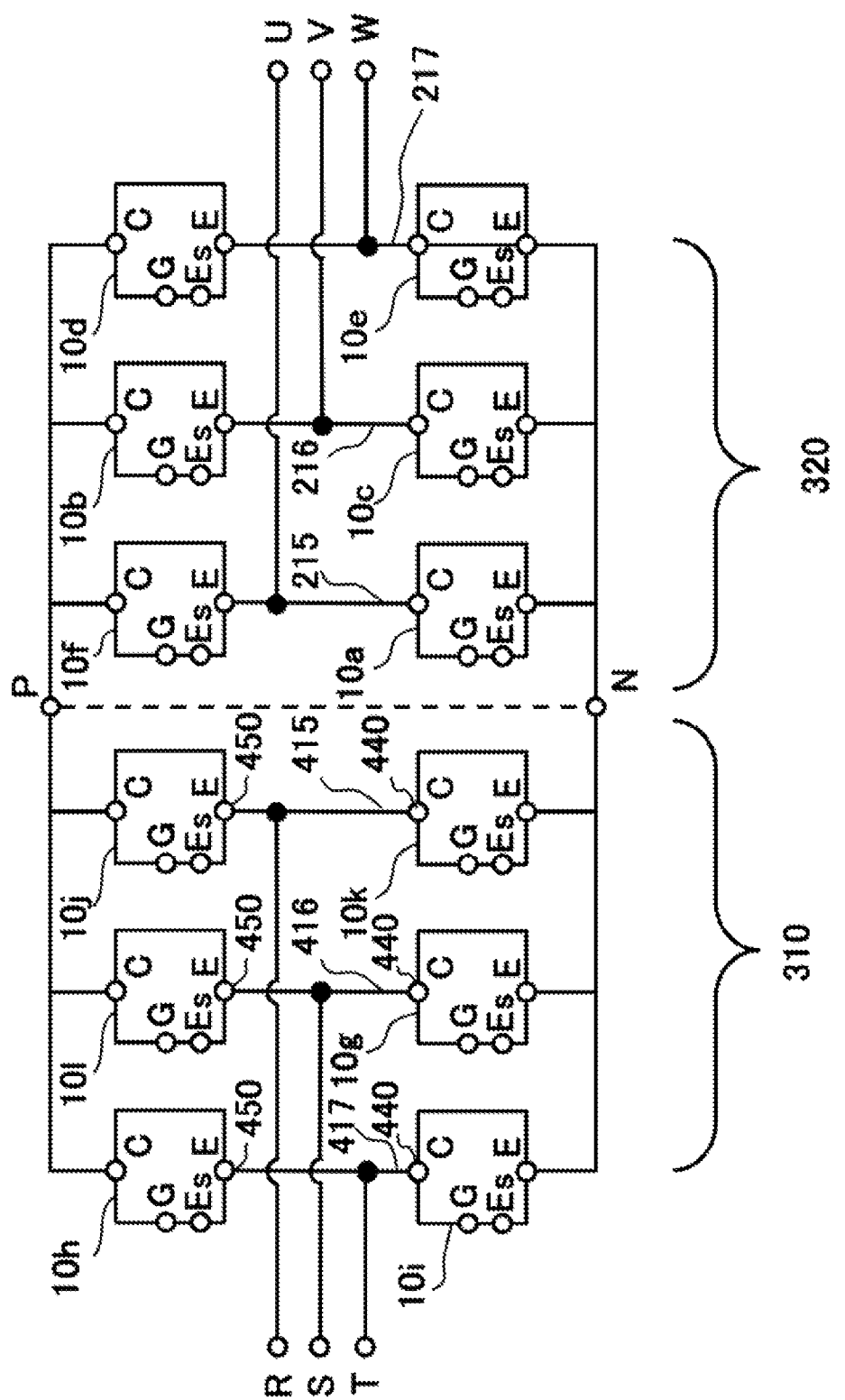
FIG. 25 shows an exemplary circuit configuration of the matrix converter.

FIG. 25 shows an exemplary circuit configuration of the matrix converter. The circuit configuration of the matrix converter is broadly separated into a circuit portion of the first inverter section 310 positioned on the input side and a circuit portion of the second inverter section 320 corresponding to the output side. The circuit portion of the first inverter section 310 and the circuit portion of the second inverter section 320 are joined to each other by the positive electrode terminal P and the negative electrode terminal N. The circuit portion of the second inverter section 320 has DC current input to the positive electrode terminal P and the negative electrode terminal N thereof and outputs three-phase AC power, but aside from this point is the same as the circuit described in FIG. 5. Accordingly, a detailed description of the circuit portion of the second inverter section 320 is omitted.

The circuit portion of the first inverter section 310 includes an R terminal, an S terminal, and a T terminal as three-phase AC input terminals. On the other hand, the circuit portion of the first inverter section 310 includes the positive electrode terminal P and the negative electrode terminal N as output terminals. The first inverter section 310 also includes six semiconductor modules 10g to 10l. In the first inverter section 310, the semiconductor modules 10l, 10h, and 10j form the upper arm, and the semiconductor modules 10g, 10i, and 10k form the lower arm.

The first main electrode 440 that is the collector electrode C of the semiconductor module 10k and the second main electrode 450 that is the emitter electrode of the semiconductor module 10j are electrically connected by the plate 415. Similarly, the first main electrode 440 that is the collector electrode C of the semiconductor module 10g and the second main electrode 450 that is the emitter electrode of the semiconductor module 10l are electrically connected by the plate 416. The first main electrode 440 that is the collector electrode C of the semiconductor module 10i and the second main electrode 450 that is the emitter electrode of the semiconductor module 10*d* are electrically connected by the plate 417.

As shown in FIG. 24, the first ring-shaped end surface 312 of the first inverter section 310 is also the first ring-shaped end surface 312 of the entire matrix converter. Furthermore, the first inverter section 310 includes a first intermediate end surface 314 at an end portion facing the second inverter section 320. The first intermediate end surface 314 may be a surface at which layers of the two inverter portions forming the matrix converter face each other. The first intermediate end surface 314 is an end portion on the output side of the first inverter section 310.

The second inverter section 320 includes a second intermediate end surface 322 and a second ring-shaped end surface 324. The second intermediate end surface 322 corresponds to the first ring-shaped end surface 22 of FIG. 1, and the second ring-shaped end surface 324 corresponds to the second ring-shaped end surface 24 of FIG. 1. The second ring-shaped end surface 324 is also the second ring-shaped end surface of the entire matrix converter. The second intermediate end surface 322 may be arranged facing the first intermediate end surface 314. Furthermore, the second intermediate end surface 322 may contact the first intermediate end surface 314.

The second intermediate end surface 322 of the second inverter section 320 is provided with the positive electrode terminal P and the negative electrode terminal N. For example, the first main electrode 140 corresponds to the positive electrode terminal P, and the second main electrode 150 corresponds to the negative electrode terminal N. The second ring-shaped end surface 324, which is on the other end side, includes the U terminal, the V terminal, and the W terminal as the three-phase AC output terminals. The configuration of such a second inverter section 320 is similar to the configuration shown in FIG. 2 to FIG. 5. Accordingly, repetitive descriptions are omitted.

Figure 26:
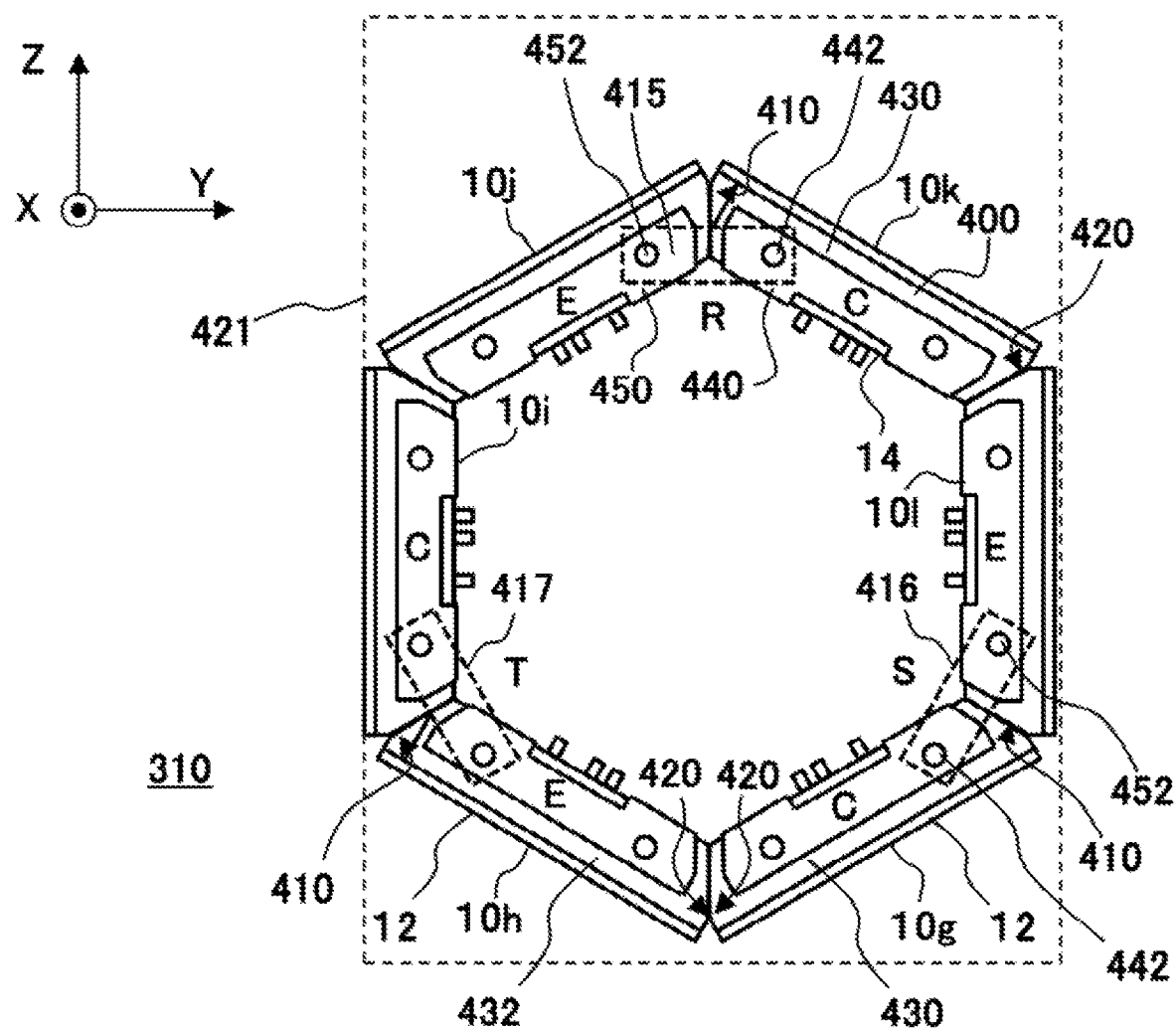
FIG. 26 is a view of the matrix converter as seen from the first ring-shaped end surface 312.
Figure 27:
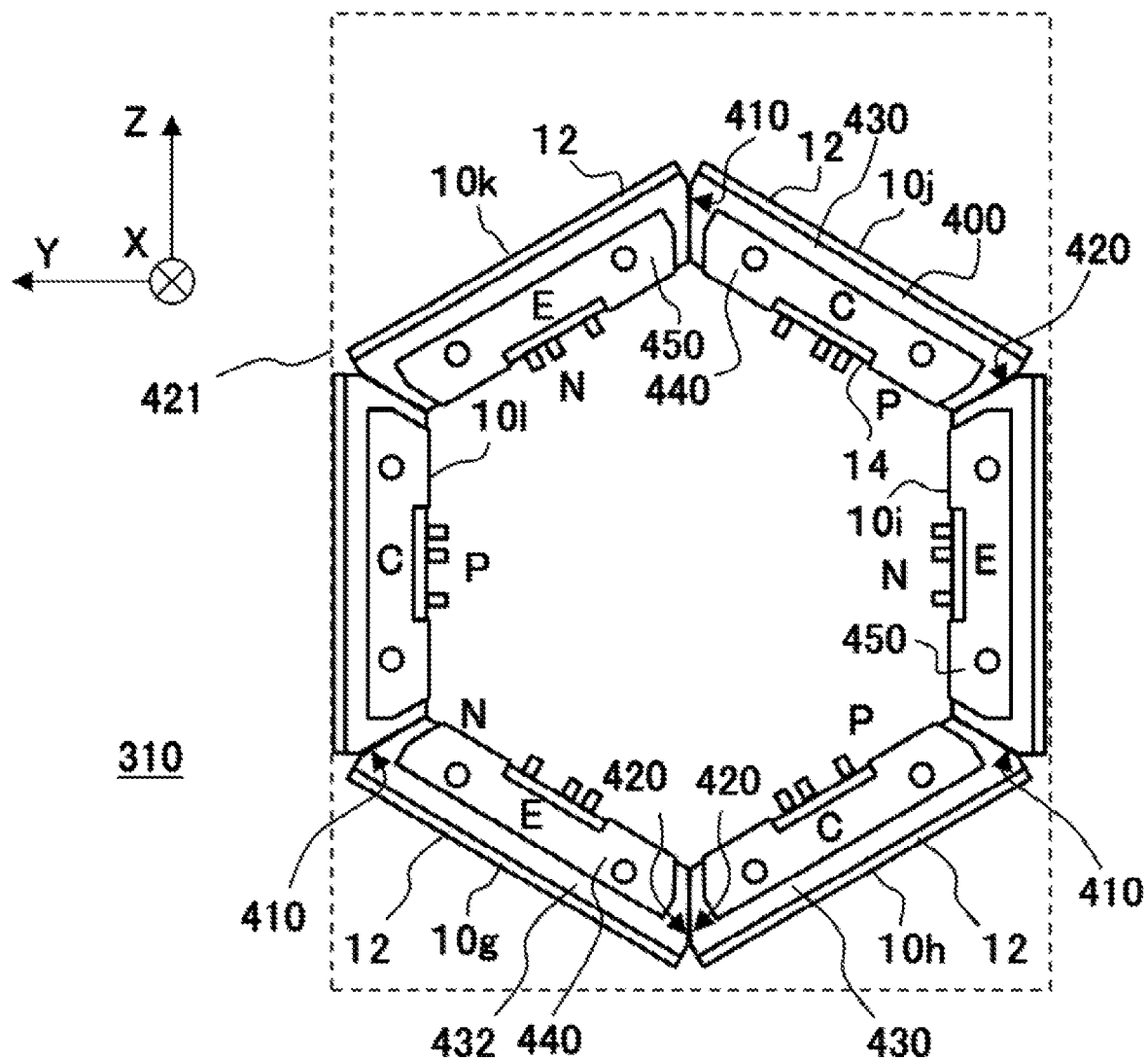
FIG. 27 is a view of the matrix converter as seen from the first intermediate end surface 314.

FIG. 26 is a view of the matrix converter as seen from the first ring-shaped end surface 312. FIG. 27 is a view of the matrix converter as seen from the first intermediate end surface 314. The second ring-shaped end surface 324 is the end portion of the second inverter section 320 on the output side. The cylindrical section 421 is formed by arranging a plurality of semiconductor modules 10, in a manner surrounding a predetermined position, in the first inverter section 310 as well.

Each semiconductor module 10 includes the base plate 12 for dissipating heat and a body 400. A first side surface 430, a second side surface 432, a third side surface 410, and a fourth side surface 420 are included between the bottom surface 13 and the top surface 14 of the body 400. The first main electrode 440 is arranged facing the first side surface 430. The second main electrode 450 is arranged facing the second side surface 432. In each semiconductor module 10, a plate fastening portion 442 and a plate fastening portion 452 may be formed respectively in the plurality of first main electrodes 440 and the plurality of second main electrodes 450, which are respectively on the first side surface 430 and the second side surface 432. The plate fastening portions 442 and the plate fastening portions 452 may include screw holes.

On the first ring-shaped end surface 312 of the cylindrical section 421, at least some of the adjacent first main electrodes 440 and second main electrodes 450 are connected to each other by plates 415, 416, and 417 secured to the plate fastening portions 442 and plate fastening portions 452. In the present example, as shown in FIG. 26, the plates 415, 416, and 417 are provided on the first ring-shaped end surface 312. The plates 415, 416, and 417 are formed of a conductive material such as metal.

The connection point caused by the plate 415, the connection point caused by the plate 416, and the connection point caused by the plate 417 correspond respectively to the R terminal, the S terminal, and the T terminal serving as the three-phase AC input terminals. Accordingly, the R terminal, the S terminal, and the T terminal serving as the three-phase AC input terminals are provided facing the AC power supply. In this way, the wires inputting the three-phase AC to the first ring-shaped end surface 312 of the cylindrical section 421 are consolidated.

In the present example, as shown in FIG. 27, the first main electrodes 440 of the semiconductor modules 10*h*, 10*j*, and 10*l* and the second main electrodes 450 of the semiconductor modules 10*i*, 10*k*, and 10*m* are arranged in an alternating manner along the circumferential direction, on the first intermediate end surface 314 of the cylindrical section 421. In other words, some of the electrodes among the plurality of first main electrodes 440 and the plurality of second main electrodes 450 are arranged on the first intermediate end surface 314. Each first main electrode 440 (collector electrode) C may be a positive electrode terminal P to which a positive DC voltage is applied. Each second main electrode 450 (emitter electrode) E may be a negative electrode terminal N to which a negative DC voltage is applied. The positive electrode terminal to which the positive DC voltage is applied and the negative electrode terminal to which the negative DC voltage is applied are included on the first intermediate end surface 314.

The first main electrodes 440 (collector electrodes) provided on the first intermediate end surface 314 of the first inverter section 310 and the first main electrodes 140 (collector electrodes) provided on the second intermediate end surface 322 of the second inverter section 320 are electrically connected. For example, the plate fastening portions 442 provided to the first main electrodes 440 of the first inverter section 310 and the plate fastening portions 142 provided to the first main electrodes 140 of the second inverter section 320 are directly linked. Similarly, the second main electrodes 450 (emitter electrodes) provided to the first intermediate end surface 314 of the first inverter section 310 and the second main electrodes 150 (emitter electrodes) provided to the second intermediate end surface 322 of the second inverter section 320 may be electrically connected. In particular, the plate fastening portions 452 provided to the second main electrodes 450 of the first inverter section 310 and the plate fastening portions 152 provided to the second main electrodes 150 of the second inverter section 320 may be directly linked.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

LIST OF REFERENCE NUMERALS

2 . . . motor drive system; 4 . . . motor drive system; 10 . . . semiconductor module; 11 . . . semiconductor module group; 12 . . . base plate; 13 . . . bottom surface; 14 . . . top surface; 15 . . . transistor; 16 . . . diode; 20 . . . power conversion apparatus; 21 . . . cylindrical section; 22 . . . first ring-shaped end surface; 24 . . . second ring-shaped end surface; 30 . . . input power source; 40 . . . motor apparatus; 50 . . . control section; 60 . . . cooling fin; 70 . . . support section; 72 . . . opening; 74 . . . opening; 76 . . . wire; 80 . . . outer heat dissipating portion; 82 . . . securing means; 90 . . . semiconductor chip; 92 . . . wire member; 100 . . . body; 110 . . . third side surface; 114 . . . first region; 115 . . . second region; 116 . . . taper; 120 . . . fourth side surface; 124 . . . first region; 125 . . . second region; 126 . . . taper; 130 . . . first side surface; 132 . . . second side surface; 140 . . . first main electrode; 142 . . . plate fastening portion; 146 . . . extending portion; 147 . . . secure fastening portion; 148 . . . first wire portion; 150 . . . second main electrode; 152 . . . plate fastening portion; 156 . . . extending portion; 157 . . . secure fastening portion; 158 . . . second wire portion; 160 . . . control terminal; 162 . . . control terminal; 164 . . . control terminal; 215 . . . plate; 216 . . . plate; 217 . . . plate; 220 . . . conductive plate; 231 . . . parallel connection plate; 241 . . . plate; 245 . . . plate; 246 . . . plate; 300 . . . power conversion apparatus; 310 . . . first inverter section; 312 . . . first ring-shaped end surface; 314 . . . first intermediate end surface; 320 . . . second inverter section; 322 . . . second intermediate end surface; 324 . . . second ring-shaped end surface; 330 . . . AC input power supply; 400 . . . body; 410 . . . third side surface; 415 . . . plate; 416 . . . plate; 417 . . . plate; 420 . . . fourth side surface; 421 . . . cylindrical section; 430 . . . first side surface; 432 . . . second side surface; 440 . . . first main electrode; 442 . . . plate fastening portion; 450 . . . second main electrode; 452 . . . plate fastening portion

What is claimed is:

1. A semiconductor module comprising:
a base plate for dissipating heat; and
a body including a bottom surface facing the base plate, a top surface on an opposite side of the bottom surface, and a plurality of side surfaces between the bottom surface and the top surface, wherein
a first main electrode through which a first main current flows is arranged facing a first side surface among the plurality of side surfaces, and a second main electrode through which a second main current flows is arranged facing a second side surface that is on an opposite side of the first side surface, and
the first main electrode is a positive electrode terminal and the second main electrode is a negative electrode terminal.

2. The semiconductor module according to claim 1, wherein
on the first side surface and the second side surface, the first main electrode and the second main electrode are each provided with a plate fastening portion for linking a plurality of semiconductor modules, each of the plurality of semiconductor modules being the semiconductor module, to each other.

3. The semiconductor module according to claim 1, further comprising:
a control terminal that controls the first main current and the second main current, wherein the control terminal protrudes from the top surface.

4. The semiconductor module according to claim 1, wherein
the first main electrode and the second main electrode are also arranged on the top surface.

5. The semiconductor module according to claim 4, wherein
the first main electrode and the second main electrode on the top surface are each provided with a secure fastening portion for linking a plurality of the semiconductor modules to each other.

6. The semiconductor module according to claim 4, wherein
the first main electrode and the second main electrode protrude respectively from the first side surface and the second side surface, and extend to the top surface.

7. The semiconductor module according to claim 4, wherein
the first main electrode and the second main electrode protrude from the top surface, and extend respectively to the first side surface and the second side surface.

8. A semiconductor module comprising:
a base plate for dissipating heat; and
a body including a bottom surface facing the base plate, a top surface on an opposite side of the bottom surface, and a plurality of side surfaces between the bottom surface and the top surface, wherein
a first main electrode through which a first main current flows is arranged facing a first side surface among the plurality of side surfaces, and a second main electrode through which a second main current flows is arranged facing a second side surface that is on an opposite side of the first side surface, and
a third side surface and a fourth side surface on a side opposite the third side surface, which are side surfaces other than the first side surface and the second side surface among the plurality of side surfaces, include tapers.

9. The semiconductor module according to claim 8, wherein
the third side surface and the fourth side surface each include a first region and a second region that is closer to the top surface than the first region, and
the tapers are formed in the second regions but are not formed in the first regions.

10. A power conversion apparatus that includes a plurality of semiconductor modules, wherein
each semiconductor module among the plurality of semiconductor modules includes a base plate for dissipating heat and a body having a bottom surface facing the base plate, a top surface on an opposite side of the bottom surface, and a plurality of side surfaces between the bottom surface and the top surface, a first main electrode through which a first main current flows is arranged facing a first side surface among the plurality of side surfaces, and a second main electrode through which a second main current flows is arranged facing a second side surface that is on an opposite side of the first side surface,
a cylindrical section is formed by arranging the plurality of semiconductor modules in a manner to surround a predetermined position,
some electrodes among the first main electrodes and the second main electrodes are arranged on a first ring-shaped end surface at one end of the cylindrical section, and
remaining electrodes among the plurality of the first main electrodes and the plurality of the second main electrodes are arranged on a second ring-shaped end surface at another end of the cylindrical section.

11. The power conversion apparatus according to claim 10, wherein
in each semiconductor module among the plurality of semiconductor modules, a third side surface and a fourth side surface on a side opposite the third side surface, which are side surfaces other than the first side surface and the second side surface among the plurality of side surfaces, include tapers, and the plurality of semiconductor modules are arranged such that the tapers of semiconductor modules adjacent to each other face each other.

12. The power conversion apparatus according to claim 10, wherein each semiconductor module among the plurality of semiconductor modules includes a control terminal that controls the first main current and the second main current, and the control terminals are arranged protruding toward an inside of the cylindrical section.

13. The power conversion apparatus according to claim 12, comprising:

at least one wire that is inserted into the inside of the cylindrical section from at least one of the one end and the other end of the cylindrical section and connected to the control terminal.

14. The power conversion apparatus according to claim 10, further comprising:

a cylindrical outer heat dissipating portion, wherein the base plate of each semiconductor module among the plurality of semiconductor modules is secured to the outer heat dissipating portion.

15. The power conversion apparatus according to claim 10, wherein plate fastening portions are formed on the first main electrode and the second main electrode respectively on the first side surface and the second side surface of each semiconductor module, and at least some of the first main electrodes and the second main electrodes that are adjacent to each other are electrically connected to each other by a plate secured to the plate fastening portion, on at least one of the first ring-shaped end surface and the second ring-shaped end surface of the cylindrical section.

16. The power conversion apparatus according to claim 10, wherein the first main electrode through which the first main current flows and the second main electrode through which the second main current flows are also arranged on the top surface of each semiconductor module, on an inner surface of the cylindrical section, a secure fastening portion for linking a plurality of the semiconductor modules to each other is provided to each of the first main electrodes and the second main electrodes on the top surface, and inside the cylindrical section, the first main electrode provided on the top surface of a semiconductor module is connected to the first main electrode or the second main electrode provided on the top surface of an adjacent semiconductor module by a plate secured to the secure fastening portion, and the second main electrode provided on the top surface of the semiconductor module is connected to the first main electrode or the second main electrode provided on the top surface of an adjacent semiconductor module by a plate secured to the secure fastening portion.

17. The power conversion apparatus according to claim 16, wherein each semiconductor module includes a third side surface and a fourth side surface on a side opposite the third side surface, which are side surfaces other than the first side surface and the second side surface among the plurality of side surfaces, and the cylindrical section is formed by arranging the plurality of semiconductor modules in a manner to surround a predetermined position, such that the third side surface of a given semiconductor module faces the third side surface or the fourth side surface of another semiconductor module adjacent thereto.

18. The power conversion apparatus according to claim 16, wherein a semiconductor module group is formed by arranging the plurality of semiconductor modules in an axial direction of the cylindrical section, such that the first side surface of a given semiconductor module faces the first side surface or the second side surface of another semiconductor module adjacent thereto, and the cylindrical section is formed by arranging a plurality of the semiconductor module groups in a manner to surround a predetermined position.

19. The power conversion apparatus according to claim 10, wherein the first ring-shaped end surface at one end of the cylindrical section is provided with a positive electrode terminal connected to a positive electrode of an input power source and a negative electrode terminal connected to a negative electrode of the input power source, and the second ring-shaped end surface at the other end of the cylindrical section is provided with a U terminal, a V terminal, and a W terminal serving as three-phase AC output terminals.

20. The power conversion apparatus according to claim 10, wherein the first main electrodes and the second main electrodes are arranged in sets of n (where n is a positive integer) in an alternating manner, on at least one of the first ring-shaped end surface and the second ring-shaped end surface.

* * * * *